US012615766B2

(12) United States Patent
Ahn

(10) Patent No.: US 12,615,766 B2
(45) Date of Patent: Apr. 28, 2026

(54) SEMICONDUCTOR DEVICE AND MANUFACTURING METHOD THEREOF

(71) Applicant: SAMSUNG ELECTRONICS CO., LTD., Suwon-si (KR)

(72) Inventor: Junhyeok Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 317 days.

(21) Appl. No.: 18/243,122

(22) Filed: Sep. 7, 2023

(65) Prior Publication Data

US 2024/0098987 A1    Mar. 21, 2024

(30) Foreign Application Priority Data

Sep. 20, 2022    (KR) ......................... 10-2022-0118819

(51) Int. Cl.
H10B 12/00    (2023.01)
(52) U.S. Cl.
CPC ............. H10B 12/50 (2023.02); H10B 12/09 (2023.02); H10B 12/315 (2023.02)
(58) Field of Classification Search
CPC ................................ H10B 12/09; H10B 12/50
See application file for complete search history.

(56) References Cited

U.S. PATENT DOCUMENTS 8,048,737 B2    11/2011  Kim et al.
8,279,683 B2 *  10/2012  Klein ................ G11C 11/40622
                                                            365/205

8,357,600 B2 *   1/2013  Shin ........................ H10B 12/09
                                                            257/E21.429
8,383,479 B2 *   2/2013  Purayath ................ H10B 41/40
                                                            438/266
8,629,494 B2 *   1/2014  Kim ........................ H10B 61/22
                                                            257/334
8,846,472 B2     9/2014  Yi
9,520,348 B2    12/2016  Choi et al.
10,896,967 B2 *  1/2021  Yoon .................. H10D 30/0223
2018/0350818 A1* 12/2018  Yoon .................... H10B 12/485
2020/0091305 A1*  3/2020  Yoon .................. H10D 30/0278
(Continued)

FOREIGN PATENT DOCUMENTS

KR        20110098386 A  *  9/2011  ......... H10D 84/0135
KR        20120003720 A  *  1/2012  .......... H10D 30/668
(Continued)

*Primary Examiner* — Edward Chin
(74) *Attorney, Agent, or Firm* — Muir Patent Law, PLLC

(57)    ABSTRACT

A semiconductor device includes a substrate having a cell array area and a peripheral circuit area, a plurality of first active areas defined in the cell array area and at least one second active area defined in the peripheral circuit area, a plurality of bit lines disposed in the substrate, a plurality of cell pad structures including a first conductive layer, a first intermediate layer, and a first metal layer having a first height from an upper surface of the first intermediate layer, and a peripheral circuit gate electrode disposed on the peripheral circuit area of the substrate and including a second conductive layer, a second intermediate layer, and a second metal layer having a second height from an upper surface of the second intermediate layer sequentially disposed on the at least one second active area, the second height being less than the first height.

20 Claims, 21 Drawing Sheets

(56)     References Cited

U.S. PATENT DOCUMENTS

2021/0272961 A1     9/2021  Tung et al.
2022/0005813 A1 *   1/2022  Kwon
2022/0093610 A1 *   3/2022  Kim ..................... H10B 12/09
2024/0172427 A1 *   5/2024  Kwon ................... H10B 12/09

FOREIGN PATENT DOCUMENTS

KR          10-1156060  B1      6/2012
KR      10-2012-0122640  A     11/2012

* cited by examiner

FIG. 4

SEMICONDUCTOR DEVICE AND MANUFACTURING METHOD THEREOF

CROSS-REFERENCE TO RELATED APPLICATION

This application is based on and claims priority under 35 U.S.C. § 119 to Korean Patent Application No. 10-2022-0118819, filed on Sep. 20, 2022, in the Korean Intellectual Property Office, the disclosure of which is incorporated by reference herein in its entirety.

BACKGROUND

1. Field

Embodiments relate to a semiconductor device and a manufacturing method thereof, and more particularly, to a semiconductor device including a cell capacitor and a manufacturing method thereof.

2. Description of the Related Art

During downscaling of a semiconductor device, a size of an individual fine circuit pattern for implementing the semiconductor device is further reduced. In addition, as the size of an individual microcircuit pattern is reduced, the difficulty in the manufacturing process may increase due to a difference in pattern density between the inside of a cell array area and a peripheral area.

SUMMARY

According to an aspect of embodiments, there is provided a semiconductor device including a substrate including a cell array area and a peripheral circuit area, and including a plurality of first active areas defined in the cell array area and at least one second active area defined in the peripheral circuit area, a plurality of bit lines disposed in the cell array area of the substrate and extending in a first direction, a plurality of cell pad structures disposed between the plurality of bit lines and each including a first conductive layer, a first intermediate layer, and a first metal layer having a first height from an upper surface of the first intermediate layer sequentially disposed on an upper surface of each of the plurality of the first active areas, and a peripheral circuit gate electrode disposed on the peripheral circuit area of the substrate and including a second conductive layer, a second intermediate layer, and a second metal layer having a second height from an upper surface of the second intermediate layer sequentially disposed on the at least one second active area, the second height being less than the first height.

According to another aspect of embodiments, there is provided a semiconductor device including a substrate including a cell array area, a boundary area, and a peripheral circuit area, and including a plurality of first active areas defined in the cell array area and at least one second active area defined in the peripheral circuit area, a plurality of bit lines disposed in the cell array area of the substrate and extending in a first direction, a plurality of cell pad structures disposed between two adjacent bit lines among the plurality of bit lines and each including a first conductive layer and a first metal layer sequentially disposed on an upper surface of each of the plurality of the first active areas, and a peripheral circuit gate electrode disposed on the peripheral circuit area of the substrate and including a second conductive layer and a second metal layer sequentially disposed on the at least one second active area, and a thickness of each of the plurality of cell pad structures is greater than a thickness of the peripheral circuit gate electrode.

According to another aspect of embodiments, there is provided a semiconductor device including a substrate including a cell array area, a boundary area, and a peripheral circuit area, and including a plurality of first active areas defined in the cell array area and at least one second active area defined in the peripheral circuit area, a plurality of bit lines disposed in the cell array area of the substrate and extending in a first direction, a direct contact disposed between each of the plurality of bit lines and each of the plurality of first active areas and electrically connecting the plurality of bit lines to the plurality of first active areas, respectively, a direct contact spacer surrounding a sidewall of the direct contact, a plurality of cell pad structures disposed between two adjacent bit lines among the plurality of bit lines and each including a first conductive layer, a first intermediate layer, and a first metal layer sequentially disposed on an upper surface of each of the plurality of the first active areas, a plurality of landing pads respectively disposed on the plurality of cell pad structures, and a peripheral circuit gate electrode disposed on the peripheral circuit area of the substrate and including a second conductive layer, a second intermediate layer, and a second metal layer sequentially disposed on the at least one second active area, the second metal layer includes a same material as a material included in the first metal layer, and the first metal layer has a first height in a vertical direction, the second metal layer has a second height in the vertical direction, the first height is greater than the second height, and a difference between the first height and the second height is equal to or greater than 5 nm.

BRIEF DESCRIPTION OF THE DRAWINGS

Features will become apparent to those of skill in the art by describing in detail exemplary embodiments with reference to the attached drawings, in which:

FIG. 4 is a cross-sectional view taken along line B2-B2' of FIG. 2.

DETAILED DESCRIPTION

Figure 1:
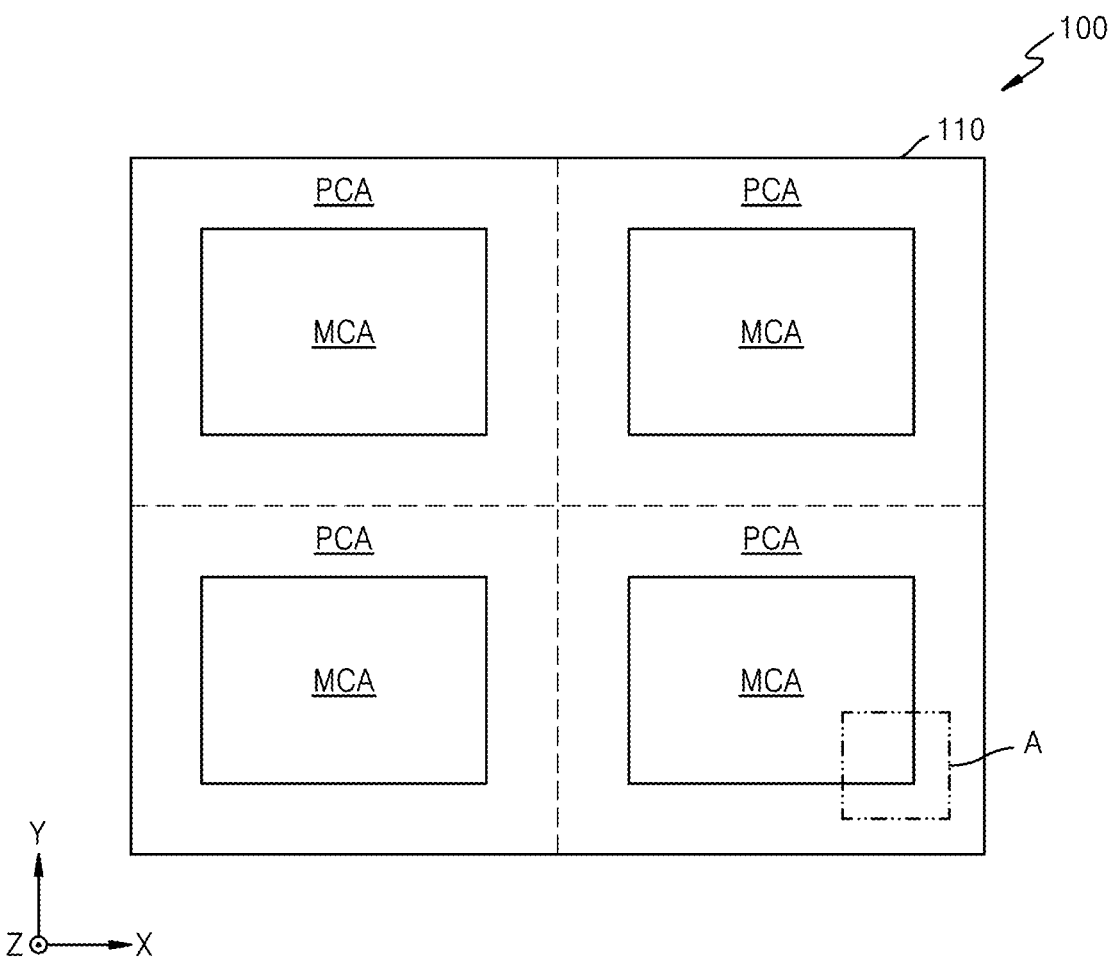
FIG. 1 is a layout diagram illustrating a semiconductor device according to some embodiments.
Figure 2:
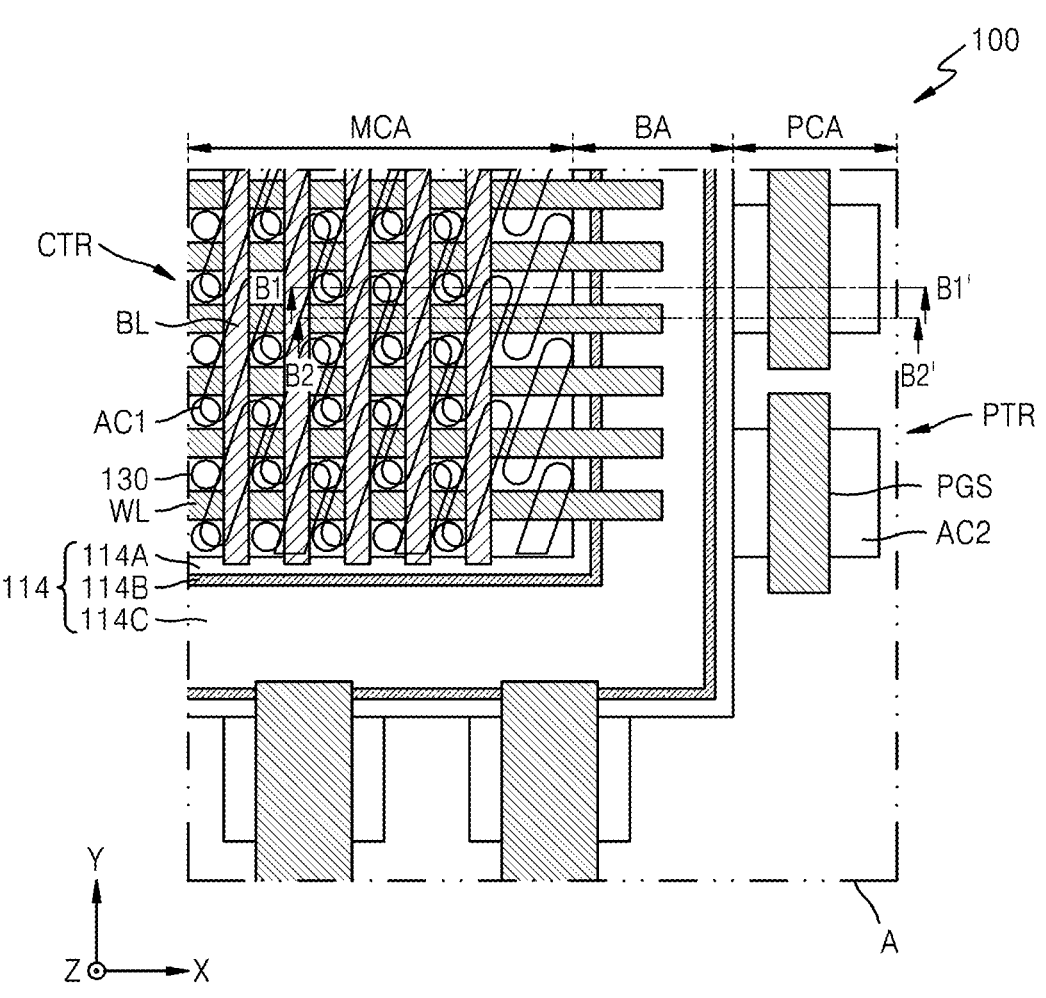
FIG. 2 is an enlarged layout diagram of a part A of FIG. 1.
Figure 3:
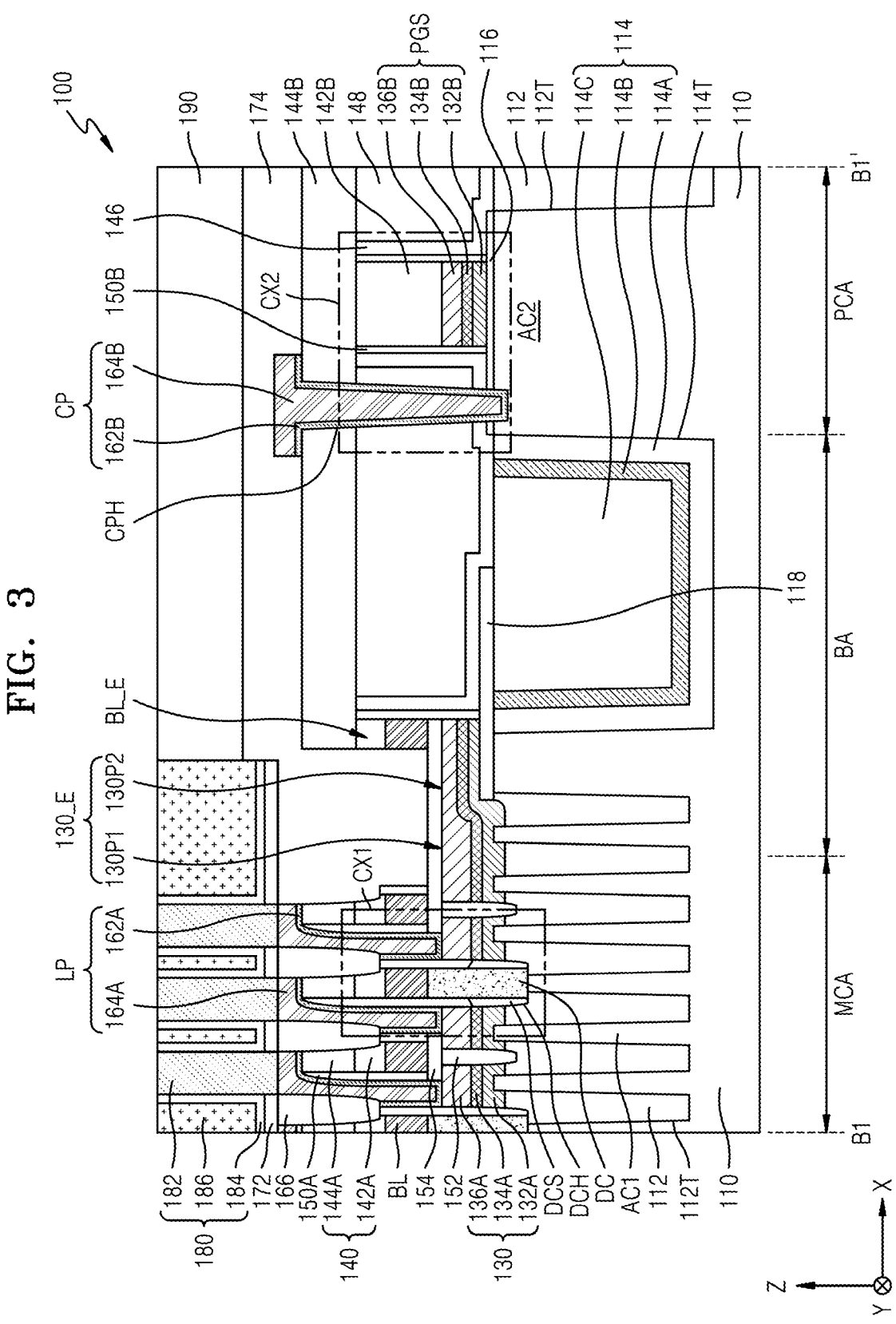
FIG. 3 is a cross-sectional view taken along line B1-B1' of FIG. 2.
Figure 4:
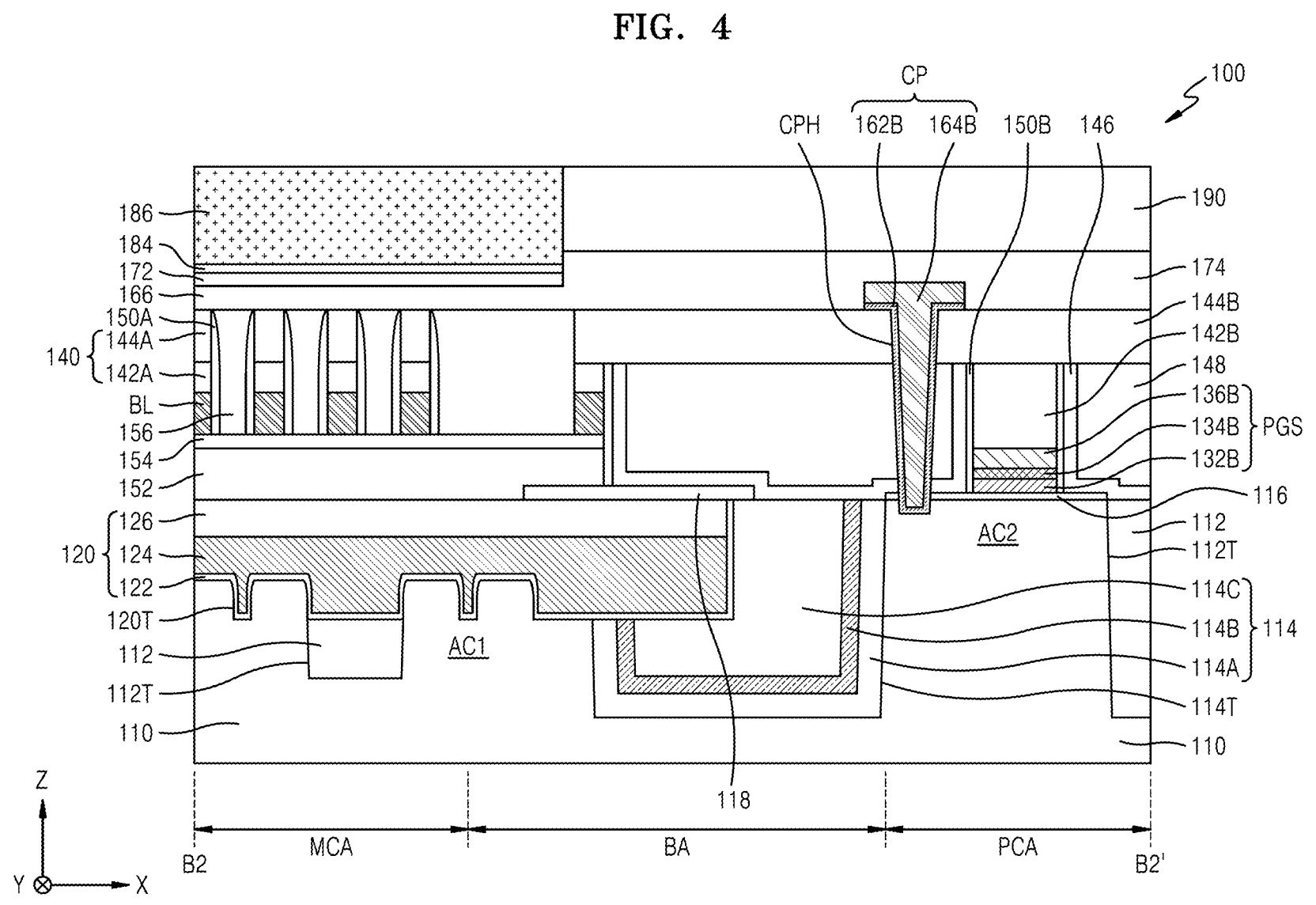
Figure 5:
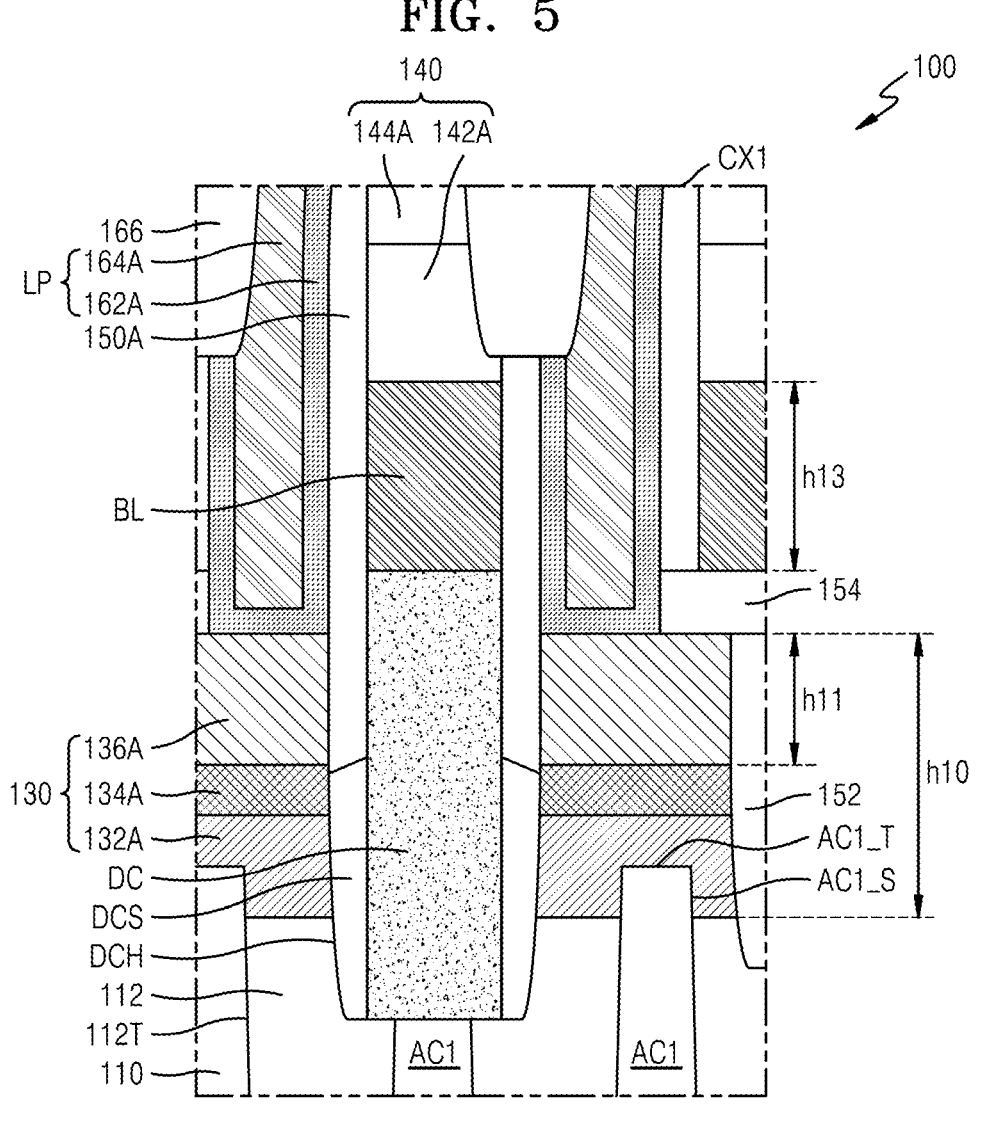
FIG. 5 is an enlarged cross-sectional view of a part CX1 of FIG. 3.
Figure 6:
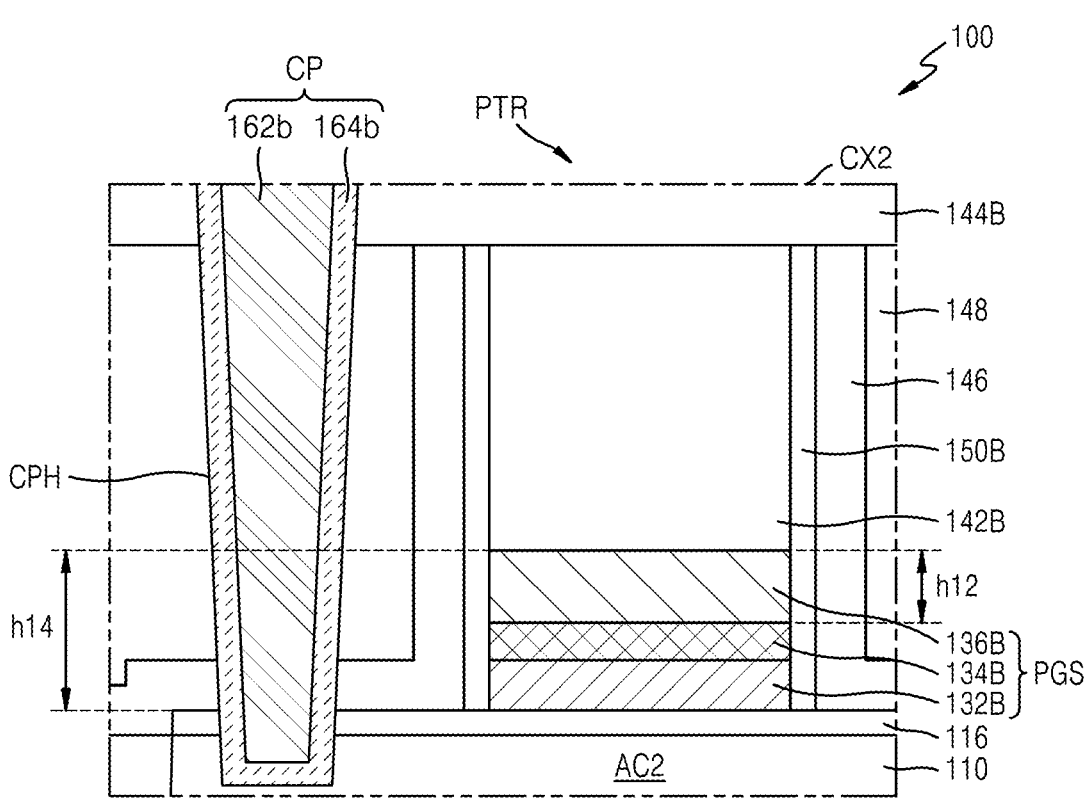
FIG. 6 is an enlarged cross-sectional view of a part CX2 of FIG. 3.

FIG. 1 is a layout diagram illustrating a semiconductor device 100 according to some embodiments. FIG. 2 is an enlarged layout diagram of a part A of FIG. 1. FIG. 3 is a cross-sectional view taken along line B1-B1' of FIG. 2. FIG. 4 is a cross-sectional view taken along line B2-B2' of FIG. 2. FIG. 5 is an enlarged cross-sectional view of a part CX1 of FIG. 3. FIG. 6 is an enlarged cross-sectional view of a part CX2 of FIG. 3.

Referring to FIG. 1, the semiconductor device 100 may include a substrate 110 including a cell array area MCA and a peripheral circuit area PCA. The cell array area MCA may be a memory cell area of a dynamic random access memory (DRAM) device, and the peripheral circuit area PCA may be a core area or a peripheral circuit area of the DRAM device. For example, as illustrated in FIG. 1, the semiconductor device 100 may include a plurality of cell array areas MCA arranged in a matrix pattern, e.g., as viewed in a top view, and each of the cell array areas MCA may be surrounded by a peripheral circuit area PCA.

For example, referring to FIGS. 2-6, the cell array area MCA may include a cell transistor CTR and a capacitor structure 180 connected thereto, and the peripheral circuit area PCA may include a peripheral circuit transistor PTR transmitting a signal and/or power to the cell transistor CTR included in the cell array area MCA. In some embodiments, the peripheral circuit transistor PTR may configure various circuits, e.g., a command decoder, control logic, an address buffer, a row decoder, a column decoder, a sense amplifier, a data input/output circuit, etc.

In detail, a device isolation trench 112T may be formed in the substrate 110, and a device isolation layer 112 may be formed in the device isolation trench 112T. A plurality of first active areas AC1 may be defined in the substrate 110 in the cell array area MCA by the device isolation layer 112, and a plurality of second active areas AC2 may be defined in the substrate 110 in the peripheral circuit area PCA by the device isolation layer 112.

A boundary trench 114T may be formed in a boundary area BA between the cell array area MCA and the peripheral circuit area PCA, and a boundary structure 114 may be formed in the boundary trench 114T. In a plan view, the boundary trench 114T may be disposed to surround four sides of the cell array area MCA. The boundary structure 114 may include a buried insulating layer 114A, an insulating liner 114B, and a gap-fill insulating layer 114C disposed inside the boundary trench 114T.

The buried insulating layer 114A may be conformally disposed on the inner wall of the boundary trench 114T. In some embodiments, the buried insulating layer 114A may include silicon oxide. For example, the buried insulating layer 114A may include silicon oxide formed by an atomic layer deposition (ALD) process, a chemical vapor deposition (CVD) process, a plasma enhanced CVD (PECVD) process, a low pressure CVD (LPCVD) process, etc.

The insulating liner 114B on the buried insulating layer 114A may be conformally disposed on the inner wall of the boundary trench 114T, e.g., the buried insulating layer 114A may be between the insulating liner 114B and the inner wall of the boundary trench 114T. In some embodiments, the insulating liner 114B may include silicon nitride. For example, the insulating liner 114B may include silicon nitride formed by an ALD process, a CVD process, a PECVD process, an LPCVD process, etc.

The gap-fill insulating layer 114C on the insulating liner 114B may fill the inside of the boundary trench 114T. In some embodiments, the gap-fill insulating layer 114C may include silicon oxide, e.g., Tonen Silazene (TOSZ), undoped silicate glass (USG), boro-phospho-silicate glass (BPSG), phosphosilicate glass (PSG), flowable oxide (FOX), plasma enhanced deposition of tetra-ethyl-ortho-silicate (PE-TEOS) or fluoride silicate glass (FSG).

In the cell array area MCA, each of the plurality of first active areas AC1 may be disposed to have a long axis in an oblique direction with respect to a first horizontal direction X and a second horizontal direction Y. A plurality of word lines WL may extend parallel to each other in the first horizontal direction X across the plurality of first active areas AC1. A plurality of bit lines BL may extend parallel to each other in the second horizontal direction Y on the plurality of word lines WL. The plurality of bit lines BL may be respectively connected to the plurality of first active areas AC1 through direct contacts DC.

A plurality of cell pad structures 130 may be formed between two adjacent bit lines BL among the plurality of bit lines BL. The plurality of cell pad structures 130 may be arranged in a line in the first horizontal direction X and the second horizontal direction Y, e.g., the plurality of cell pad structures 130 may be spaced apart from each other along each of the first horizontal direction X and the second horizontal direction Y. A plurality of landing pads LP may be respectively formed on the plurality of cell pad structures 130. The plurality of cell pad structures 130 and the plurality of landing pads LP may connect a lower electrode 182 of the capacitor structure 180 formed on the plurality of bit lines BL to the first active area AC1. Each of the plurality of landing pads LP may be disposed to partially overlap the cell pad structure 130.

For example, the substrate 110 may include silicon, e.g., monocrystalline silicon, polycrystalline silicon, or amorphous silicon. In another example, the substrate 110 may include at least one of Ge, SiGe, SiC, GaAs, InAs, or InP. In yet another example, the substrate 110 may include a conductive area, e.g., a well doped with impurities or a structure doped with impurities. The device isolation layer 112 may include, e.g., an oxide layer, a nitride layer, or a combination thereof.

In the cell array area MCA, a plurality of word line trenches 120T extending in the first horizontal direction (X direction) may be disposed in the substrate 110, and a buried gate structure 120 may be disposed in each of the plurality of word line trenches 120T. The buried gate structure 120 may include a gate dielectric layer 122, a gate electrode 124, and a capping insulating layer 126 disposed in each of the plurality of word line trenches 120T. A plurality of gate electrodes 124 may respectively correspond to the plurality of word lines WL illustrated in FIG. 2.

The plurality of gate dielectric layers 122 may include, e.g., a silicon oxide layer, a silicon nitride layer, a silicon oxynitride layer, an oxide/nitride/oxide (ONO) layer, or a high-k dielectric film having a higher dielectric constant than the silicon oxide layer. The plurality of gate electrodes 124 may include, e.g., Ti, TiN, Ta, TaN, W, WN, TiSiN, WSiN, or a combination thereof. The plurality of capping insulating layers 126 may include, e.g., a silicon oxide layer, a silicon nitride layer, a silicon oxynitride layer, or a combination thereof.

The plurality of word line trenches 120T may extend from the cell array area MCA into the boundary area BA, and an end of each of the plurality of word line trenches 120T may vertically overlap the boundary structure 114 in the boundary area BA. For example, as illustrated in FIG. 4, an end of each of the plurality of word line trenches 120T may partially extend into the boundary area BA to intersect one side of the buried insulating layer 114A, one side of the insulating liner 114B, and a portion of the gap-fill insulating layer 114C.

A buffer layer 118 may be formed on the substrate 110, the buried gate structure 120, and the boundary structure 114 in the boundary area BA. The buffer layer 118 may include, e.g., an oxide layer, a nitride layer, or a combination thereof.

A plurality of direct contacts DC may be respectively formed in a plurality of direct contact holes DCH in the substrate 110. The plurality of direct contacts DC may be respectively connected to the plurality of first active areas AC1. Each of the plurality of direct contacts DC may include TiN, TiSiN, W, tungsten silicide, doped polysilicon, or a combination thereof.

A direct contact spacer DCS may be disposed on an inner wall of the direct contact hole DCH. The direct contact spacer DCS may be disposed on a lower sidewall of the direct contact hole DCH and may cover a lower side of the direct contact DC.

The plurality of bit lines BL may extend on the substrate 110 and the plurality of direct contacts DC in the second horizontal direction Y. Each of the plurality of bit lines BL may be connected to the first active area AC1 through the direct contact DC. Each of the plurality of bit lines BL may include, e.g., ruthenium (Ru), tungsten (W), cobalt (Co), titanium (Ti), titanium nitride (TiN), or a combination thereof.

The plurality of bit lines BL may be respectively covered with a plurality of insulating capping structures 140. The plurality of insulating capping structures 140 may extend on the plurality of bit lines BL in the second horizontal direction Y. Each of the plurality of insulating capping structures 140 may include a lower capping pattern 142A and an upper capping pattern 144A.

A bit line spacer 150A may be disposed on both, e.g., opposite, sidewalls of each of the plurality of bit lines BL. The bit line spacer 150A may extend on both sidewalls of each of the plurality of bit lines BL in the second horizontal direction Y, and a part of the bit line spacer 150A may extend into the direct contact hole DCH to cover the upper sidewall of the direct contact DC. Although FIG. 3 shows that the bit line spacer 150A is a single material layer, in some embodiments, the bit line spacer 150A may be formed as a stacked structure of a plurality of spacer layers, and at least one of the plurality of spacer layers may be an air spacer.

A plurality of cell pad structures 130 may be disposed between the plurality of respective bit lines BL. For example, one cell pad structure 130 may be disposed between two adjacent bit lines BL at a vertical level lower than that of the bit line BL. For example, an insulating pattern 152 may be formed between two cell pad structures 130 disposed in the first horizontal direction X and between two cell pad structures 130 disposed in the second horizontal direction Y, and may electrically separate the two adjacent cell pad structures 130 from each other. In addition, a lower side of a part of the sidewall the cell pad structure 130 may contact the direct contact spacer DCS, and an upper side of the part of the sidewall of the cell pad structure 130 may contact the bit line spacer 150A.

In some embodiments, the plurality of cell pad structures 130 may include a first conductive layer 132A, a first intermediate layer 134A, and a first metal layer 136A sequentially disposed on the first active area AC1. In some embodiments, the first conductive layer 132A may include, e.g., Si, Ge, W, WN, Co, Ni, Al, Mo, Ru, Ti, TiN, Ta, TaN, Cu, or combinations thereof. The first intermediate layer 134A and the first metal layer 136A may include, e.g., TiN, TiSiN, W, tungsten silicide, or a combination thereof. For example, as illustrated in FIG. 5, the bottommost surface of the first conductive layer 132A may be disposed at a level lower than a top surface AC1_T of the first active area AC1, e.g., relative to a bottom of the substrate 110, and the first conductive layer 132A may be disposed to cover the top surface AC1_T and a sidewall AC1_S of the active area AC1. For example, as illustrated in FIG. 5, the first conductive layer 132A may continuously extend along an entire top surface AC1_T of the active area AC1 and along a portion of a sidewall AC1_S of the active area AC1, e.g., the first conductive layer 132A may have a H-shaped cross-section. Accordingly, a relatively large contact area between the first conductive layer 132A and the first active area AC1 may be secured. In another example, the bottommost surface of the first conductive layer 132A may be disposed at substantially the same level as the top surface AC1_T of the first active area AC1, and accordingly, the bottom surface of the first conductive layer 132A may have a flat profile.

An insulating layer 154 covering the cell pad structure 130 and the insulating pattern 152 may be disposed on the cell pad structure 130. A plurality of insulating fences 156 may be disposed between two adjacent bit lines BL in the second horizontal direction Y. The plurality of insulating fences 156 may be respectively disposed on the insulating layer 154 at positions vertically overlapping the plurality of word line trenches 120T.

The plurality of landing pads LP may be respectively disposed on the plurality of cell pad structures 130. Each of the plurality of landing pads LP may include a conductive barrier film 162A and a conductive landing pad layer 164A. The conductive barrier film 162A may include, e.g., Ti, TiN, or a combination thereof. The conductive landing pad layer 164A may include, e.g., metal, metal nitride, conductive polysilicon, or a combination thereof. For example, the conductive landing pad layer 164A may include W. The plurality of landing pads LP may have a plurality of island-type pattern shapes in a plan view.

The plurality of landing pads LP may be electrically insulated from each other by an insulating pattern 166 surrounding the plurality of landing pads LP. The insulating pattern 166 may include, e.g., at least one of silicon nitride, silicon oxide, and silicon oxynitride.

A first etch stop layer 172 may be disposed on the landing pad LP and the insulating pattern 166 in the cell array area MCA. The capacitor structure 180 may be disposed on the first etch stop layer 172. The capacitor structure 180 may include a plurality of lower electrodes 182, a capacitor dielectric layer 184, and an upper electrode 186.

The plurality of lower electrodes 182 may penetrate the first etch stop layer 172 and respectively extend on the plurality of landing pads LP in the vertical direction Z. Bottom portions of the plurality of lower electrodes 182 may penetrate the first etch stop layer 172 and be connected to the landing pad LP. The capacitor dielectric layer 184 may be disposed on the plurality of lower electrodes 182. The upper electrode 186 may be disposed to cover the plurality of lower electrodes 182 on the capacitor dielectric layer 184.

In some embodiments, the capacitor dielectric layer 184 may include, e.g., at least one of zirconium oxide, hafnium oxide, titanium oxide, niobium oxide, tantalum oxide, yttrium oxide, strontium titanium oxide, barium strontium titanium oxide, scandium oxide, or lanthanide oxide. The lower electrode 182 and the upper electrode 186 may include at least one of metal, e.g., ruthenium (Ru), titanium (Ti), tantalum (Ta), niobium (Nb), iridium (Ir), molybdenum (Mo), tungsten (W), etc., conductive metal nitride, e.g., titanium nitride (TiN), tantalum nitride (TaN), niobium nitride (NbN), molybdenum nitride (MoN), tungsten nitride (WN), etc., or conductive metal oxides, e.g., iridium oxide (IrO$_2$), ruthenium oxide (RuO$_2$), strontium ruthenium oxide (SrRuO$_3$), etc.

In some embodiments, the plurality of lower electrodes 182 may have a pillar shape extending in the vertical direction Z, and each of the plurality of lower electrodes 182 may have a circular horizontal cross-section. However, the horizontal cross-sectional shape of each of the plurality of lower electrodes 182 is not limited thereto, and each of the plurality of lower electrodes 182 may have a horizontal cross-section of various shapes, e.g., ovals, polygons (e.g., rectangles, rhombuses, trapezoids, etc.), and various rounded polygons (e.g., rounded rectangles). In addition, although FIG. 3 shows that each of the plurality of lower electrodes 182 has a pillar shape having a circular horizontal cross-section, in some embodiments, the plurality of lower electrodes 182 may also have a cylindrical shape with a closed bottom.

The peripheral circuit transistor PTR may be disposed on the second active area AC2 in the peripheral circuit area PCA. The peripheral circuit transistor PTR may include a gate dielectric layer 116, a peripheral circuit gate electrode PGS, and a gate capping pattern 142B sequentially stacked on the second active area AC2.

The gate dielectric layer 116 may include, e.g., at least one of a silicon oxide layer, a silicon nitride layer, a silicon oxynitride layer, an ONO layer, or a high-k dielectric film having a higher dielectric constant than the silicon oxide layer. The gate capping pattern 142B may include, e.g., a silicon nitride layer.

The peripheral circuit gate electrode PGS may include a second conductive layer 132B, a second intermediate layer 134B, and a second metal layer 136B. In some embodiments, the second conductive layer 132B may include, e.g., Si, Ge, W, WN, Co, Ni, Al, Mo, Ru, Ti, TiN, Ta, TaN, Cu, or a combination thereof. The second intermediate layer 134B and the second metal layer 136B may include, e.g., TiN, TiSiN, W, tungsten silicide, or a combination thereof.

In some embodiments, materials of the second conductive layer 132B, the second intermediate layer 134B, and the second metal layer 136B may be respectively the same as materials of the first conductive layer 132A, the first intermediate layer 134A, and the first metal layer 136A included in the cell pad structure 130 in the cell array area MCA. For example, the peripheral circuit gate electrode PGS may be formed simultaneously in the process of forming the cell pad structure 130.

As shown in FIGS. 5 and 6, the first metal layer 136A included in the cell pad structure 130 may have a first height h11 in the vertical direction Z, and the second metal layer 136B included in the peripheral circuit gate electrode PGS may have a second height h12 in the vertical direction Z. In some embodiments, the second height h12 may be the same as the first height h11. For example, the first metal layer 136A may be made of the same material as the second metal layer 136B in the same process. However, in an embodiment, the upper side of the second metal layer 136B may be etched through a separate process to be described below. Accordingly, before etching, the first height h11 of the first metal layer 136A in the vertical direction Z may be the same as the second height of the second metal layer 136B in the vertical direction Z. After etching, the first height h11 of the first metal layer 136A may be greater than the second height h12 of the second metal layer 136B.

According to a process of the semiconductor device 100 to be described below, the cell pad structure 130 may be formed by being stacked in the same process as the peripheral circuit gate electrode PGS. However, as described above, the first height h11 may be greater than the second height h12. Therefore, a total height h10 of the cell pad structure 130 including the first metal layer 136A in the vertical direction Z may be greater than a total height h14 of the peripheral circuit gate electrode PGS including the second metal layer 136B in the vertical direction Z.

In an embodiment, a difference between the total height h10 of the cell pad structure 130 including the first metal layer 136A in the vertical direction Z and the total height h14 of the peripheral circuit gate electrode PGS including the second metal layer 136B in the vertical direction Z may be equal to or greater than 5 nm. In an embodiment, the difference between the total height h10 of the cell pad structure 130 including the first metal layer 136A in the vertical direction Z and the total height h14 of the peripheral circuit gate electrode PGS including the second metal layer 136B in the vertical direction Z may be equal to or greater than 14 nm.

When the second height h12 of the second metal layer 136B is less than the first height h11 of the first metal layer 136A, because the height h14 of the peripheral circuit gate electrode PGS in the vertical direction Z is reduced, the patterning difficulty of a peripheral circuit gate may be reduced. For example, the patterning difficulty of the gate capping pattern 142B, the insulating spacer 150B, and the passivation layer 146 may be reduced.

The bit line BL may have a third height h13 in the vertical direction Z, and the third height h13 may be different from the first height h11 and the second height h12. Also, a material of the bit line BL may be different from a material of the second metal layer 136B. In some examples, the second metal layer 136B included in the peripheral circuit gate electrode PGS may include, e.g., tungsten (W), the first metal layer 136A included in the cell pad structure 130 may include, e.g., tungsten (W), and the bit line BL may include, e.g., ruthenium (Ru).

Both sidewalls of the peripheral circuit gate electrode PGS and the gate capping pattern 142B may be covered with an insulating spacer 150B. The insulating spacer 150B may include, e.g., an oxide layer, a nitride layer, or a combination thereof. The peripheral circuit transistor PTR and the insulating spacer 150B may be covered by a passivation layer 146, and a first interlayer insulating layer 148 may be disposed on the passivation layer 146 to fill a space between two adjacent peripheral circuit transistors PTR. A capping insulating layer 144B may be disposed on the first interlayer insulating layer 148 and the passivation layer 146.

A contact plug CP may be formed in the contact hole CPH penetrating the first interlayer insulating layer 148 and the capping insulating layer 144B in the vertical direction Z in the peripheral circuit area PCA. The contact plug CP may be spaced apart from and located on the side surface of the peripheral circuit gate electrode PGS. Like the plurality of landing pads LP formed in the cell array area MCA, the contact plug CP may include a plug conductive barrier film 162B and a plug conductive layer 164B. A metal silicide layer may be disposed between the second active area AC2 and the contact plug CP.

When a voltage is applied to the peripheral circuit gate electrode PGS and the contact plug CP to generate current, capacitance may be formed on the contact plug CP adjacent to the peripheral circuit gate electrode PGS. This may be due to an effect of an electric field, etc. caused by a current on the contact plug CP located on the side surface of the peripheral circuit gate electrode PGS. A current flowing on the contact plug CP may be affected by the capacitance formed on the contact plug CP due to the peripheral circuit gate electrode PGS.

The length of an area of the peripheral circuit area PCA in the vertical direction Z overlapping the contact plug CP on the horizontal plane in the first direction X or the second direction Y may be the same as the height h14 of the peripheral circuit gate electrode PGS in the vertical direction Z (e.g., a vertical length of an overlap between side surfaces of the contact plug CP and the peripheral circuit gate electrode PGS in the horizontal direction equals the total height h14 of the peripheral circuit gate electrode PGS). The second height h12, when a part of the first metal layer 136 to be described below located in the peripheral circuit area PCA and the boundary area BA is etched, is reduced compared to the case where etching is not performed. Therefore, compared to the case where etching is not performed, when etching is performed, the height of the area of the peripheral circuit area PCA in the vertical direction Z overlapping the contact plug CP on the horizontal plane in the first direction X or the second direction Y is reduced (e.g., the overlap length between side surfaces of the contact plug CP and the peripheral circuit gate electrode PGS in the horizontal direction may be reduced due to a decreased thickness of the second height h12 caused by etching).

The height h14 of the overlapping area of the peripheral circuit area PCA in the vertical direction Z is reduced, and accordingly, the influence of the peripheral circuit gate electrode PGS on the contact plug CP may be reduced. Accordingly, the capacitance formed on the contact plug CP due to the current flowing in the peripheral circuit gate electrode PGS may be reduced. For example, the capacitance is reduced, and thus, a propagation delay time tPD of the semiconductor device 100 may be improved.

A second etch stop layer 174 covering the contact plug CP may be disposed on the capping insulating layer 144B. A second interlayer insulating layer 190 covering the capacitor structure 180 may be disposed on the second etch stop layer 174.

As shown in FIG. 3, an outermost cell pad structure 130 among the plurality of cell pad structures 130 (e.g., a cell pad structure 130 among the plurality of cell pad structures 130 that is closest to the boundary area BA) may extend onto boundary area BA. The cell pad structure 130 disposed on the boundary area BA may be referred to as a cell pad extension portion 130_E.

The cell pad extension portion 130_E may include a first part 130P1 and a second part 130P2 connected to each other, e.g., the first part 130P1 and the second part 130P2 may be seamlessly integrated into a single structure. The first part 130P1 may be disposed on the first active area AC1 and the device isolation layer 112, and the second part 130P2 may be disposed on the buffer layer 118. When a part of the first metal layer 136 located in the peripheral circuit area PCA and the boundary area BA is not etched, the second part 130P2 may have an upper surface disposed at a higher level than the upper surface of the first part 130P1 by the thickness of the buffer layer 118.

In an embodiment, when the first metal layer 136 located in the peripheral circuit area PCA and the boundary area BA is etched, a height difference between the upper surface of the first part 130P1 and the upper surface of the second part 130P2 by the thickness of the buffer layer 118 may be reduced or removed compared to the case where etching is not performed. For example, as shown in FIG. 3, there may be no height difference between the upper surface of the first part 130P1 and the upper surface of the second part 130P2. In other words, the upper surface of the first part 130P1 and the upper surface of the second part 130P2 may be formed on the same plane, e.g., the upper surfaces of the first part 130P1 and the second part 130P2 may be coplanar and level with each other.

An edge conductive layer BL_E may be disposed on the second part 130P2 of the cell pad extension portion 130_E. The edge conductive layer BL_E may refer to a part of a bit line conductive layer 138 (see FIG. 16) for forming the bit line BL remaining after a process of patterning the bit line BL. However, in some embodiments, a process of removing the edge conductive layer BL_E may be further performed, and in this case, the edge conductive layer BL_E may be omitted.

In general, the peripheral circuit gate electrode may be formed to have the same stack configuration as the bit line, e.g., metal layers included in the bit line and the peripheral circuit gate electrode may be formed simultaneously to have the same material and/or the same height. However, in the process of patterning the bit line, it may be difficult to precisely adjust a patterning process due to a relatively large level difference at an edge area of a cell block, e.g., due to a level step difference of the upper surface of the cell pad extension portion in the boundary area, thereby causing potential process defects.

In contrast, according to some embodiments, the cell pad structure 130 and the peripheral circuit gate electrode PGS may be formed, e.g., simultaneously, to have the same stack configuration, e.g., but with different heights of metal layers. Accordingly, process defects due to the level step difference of the upper surface of the cell pad extension portion 130_E disposed in the boundary area BA may be prevented or substantially minimized. Also, the material included in the bit line BL may be selected independently from the material of the peripheral circuit gate electrode PGS, thereby optimizing performance of the semiconductor device 100.

Figure 7A:
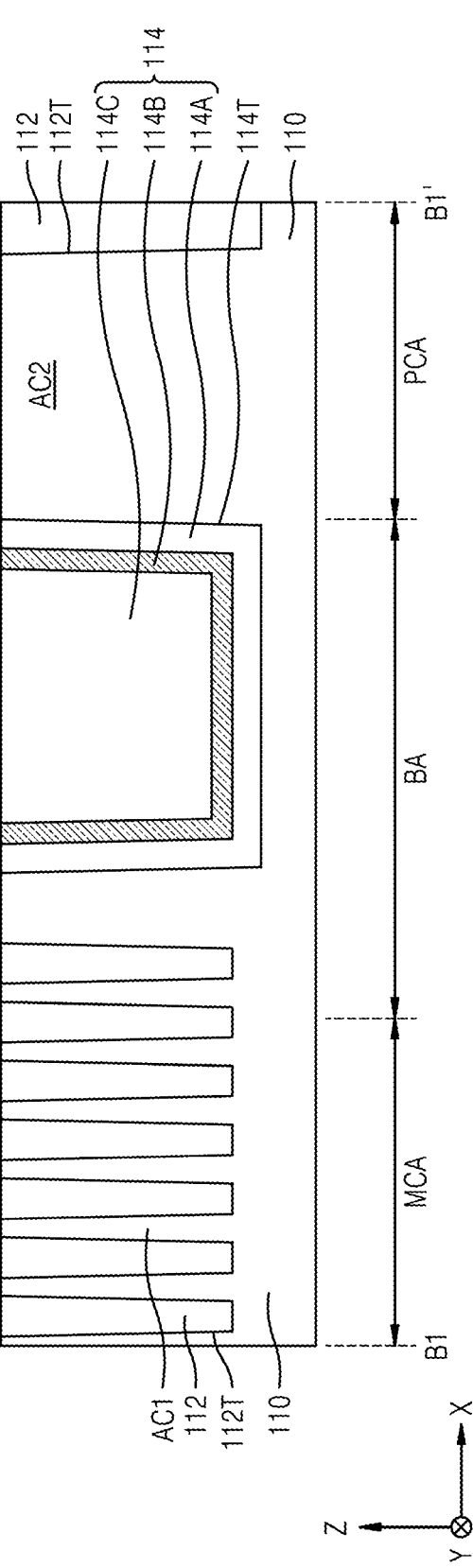
FIGS. 7A to 19 are cross-sectional views of stages in a manufacturing method of a semiconductor device according to some embodiments.

FIGS. 7A to 19 are cross-sectional views illustrating stages in a manufacturing method of the semiconductor device 100 according to some embodiments. Specifically, FIGS. 7B, 9 to 16, 17A, 18, and 19 are cross-sectional views corresponding to a cross-section taken along line B1-B1' of FIG. 2, and FIGS. 7A and 8 are cross-sectional views corresponding to a cross-section taken along line B2-B2' of FIG. 2. In FIGS. 7A to 19, the same reference numerals as in FIGS. 1 to 6 denote the same components.

Figure 7B:
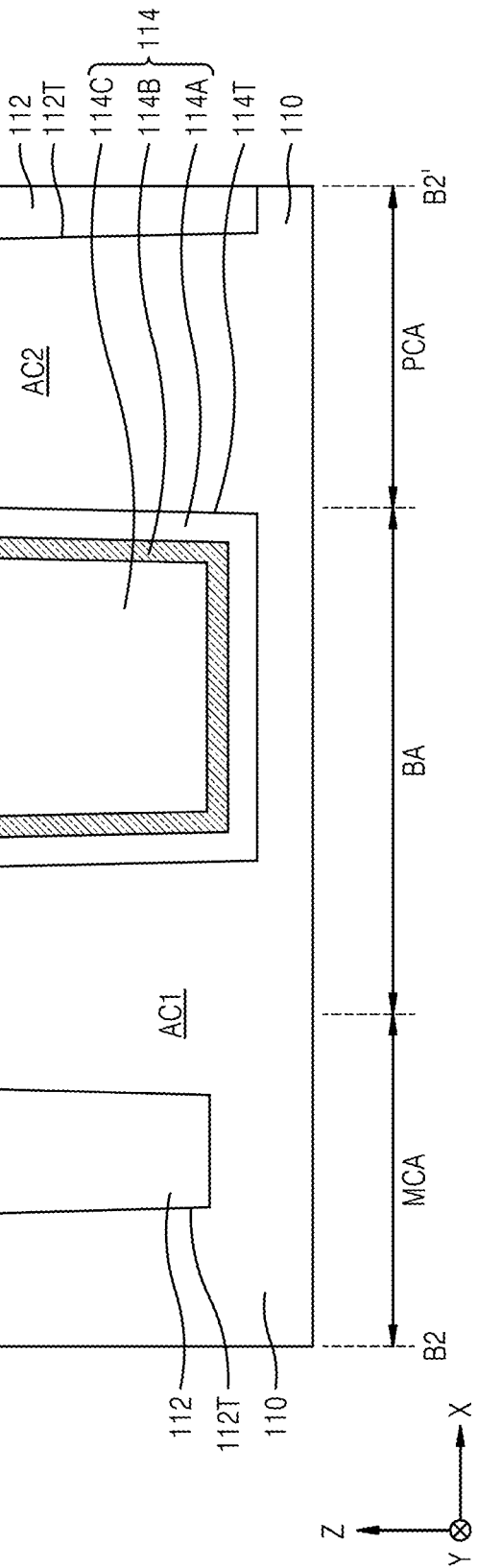
Figure 8:
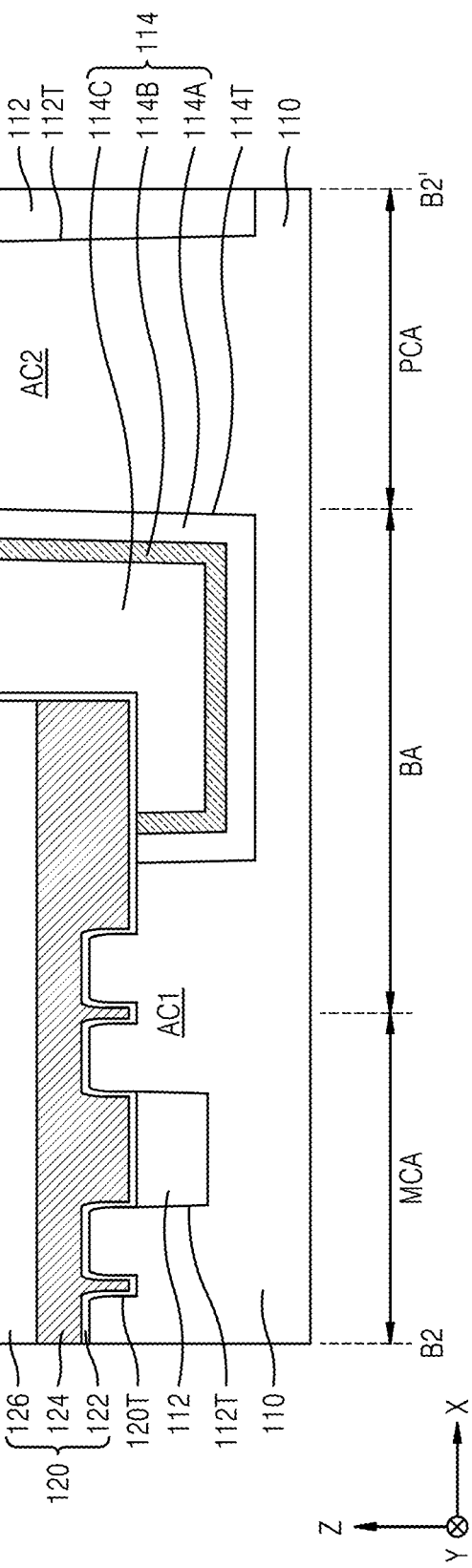

Referring to FIGS. 7A and 7B, the plurality of device isolation trenches 112T may be formed in the cell array area MCA and the peripheral circuit area PCA of the substrate 110, and the boundary trench 114T may be formed in the boundary area BA of the substrate 110. Thereafter, the device isolation layer 112 filling the plurality of device isolation trenches 112T may be formed in the cell array area MCA and the peripheral circuit area PCA.

The plurality of first active areas AC1 are defined in the cell array area MCA of the substrate 110, and the second active area AC2 is defined in the peripheral circuit area PCA by the formation of the device isolation layer 112. In some embodiments, the device isolation layer 112 may be made of, e.g., silicon oxide, silicon nitride, silicon oxynitride, or a combination thereof. In some examples, the device isolation layer 112 may be formed in a double-layer structure of a silicon oxide layer and a silicon nitride layer.

Thereafter, the buried insulating layer 114A, the insulating liner 114B, and the gap-fill insulating layer 114C may be sequentially formed on the inner wall of the boundary trench 114T, and the boundary structure 114 may be formed by planarizing the buried insulating layer 114A and the insulating liner 114B until the upper surface of the substrate 110 is exposed.

In some embodiments, the buried insulating layer 114A may be formed by using, e.g., an ALD process, a CVD process, a PECVD process, an LPCVD process, etc. For example, a process of forming the buried insulating layer 114A may be performed in the same operation as at least some operations of a process of forming the device isolation layer 112. In some embodiments, the process of forming the buried insulating layer 114A may be separately performed after the process of forming the device isolation layer 112.

In some embodiments, the insulating liner 114B may be made of, e.g., silicon nitride by using an ALD process, a CVD process, a PECVD process, an LPCVD process, etc. The gap-fill insulating layer 114C may be formed on the insulating liner 114B to fill the inside of the boundary trench 114T. The gap-fill insulating layer 114C may be formed to be sufficiently thick to completely fill the remaining part of the inside of the boundary trench 114T. For example, the gap-fill insulating layer 114C may include silicon oxide, e.g., Tonen Silazane (TOSZ), undoped silicate glass (USG), boro-phospho-silicate glass (BPSG), phosphosilicate glass (PSG), flowable oxide (FOX), plasma enhanced deposition of tetra-ethyl-ortho-silicate (PE-TEOS) or fluoride silicate glass (FSG).

Referring to FIG. 8, the word line trench 120T may be formed by forming a mask pattern on the substrate 110 and removing a part of the cell array area MCA of the substrate 110 using the mask pattern as an etch mask. The word line trench 120T may be disposed to extend from the cell array area MCA to a part of the boundary area BA. For example, the mask pattern for forming the word line trench 120T may be formed by using a double patterning technique (DPT) or a quadruple patterning technique (QPT).

Thereafter, the gate dielectric layer 122, the gate electrode 124, and the capping insulating layer 126 may be sequentially formed in the word line trench 120T.

For example, the gate dielectric layer 122 may be conformally disposed on the inner wall of the word line trench 120T. The gate electrode 124 may be formed by filling the word line trench 120T with a conductive layer and then exposing a part of the upper side of the word line trench 120T again by etching back the upper portion of the conductive layer. The capping insulating layer 126 may be formed by filling the remaining part of the word line trench 120T with an insulating material and planarizing the insulating material so that the upper surface of the buried insulating layer 114A is exposed.

Figure 9:
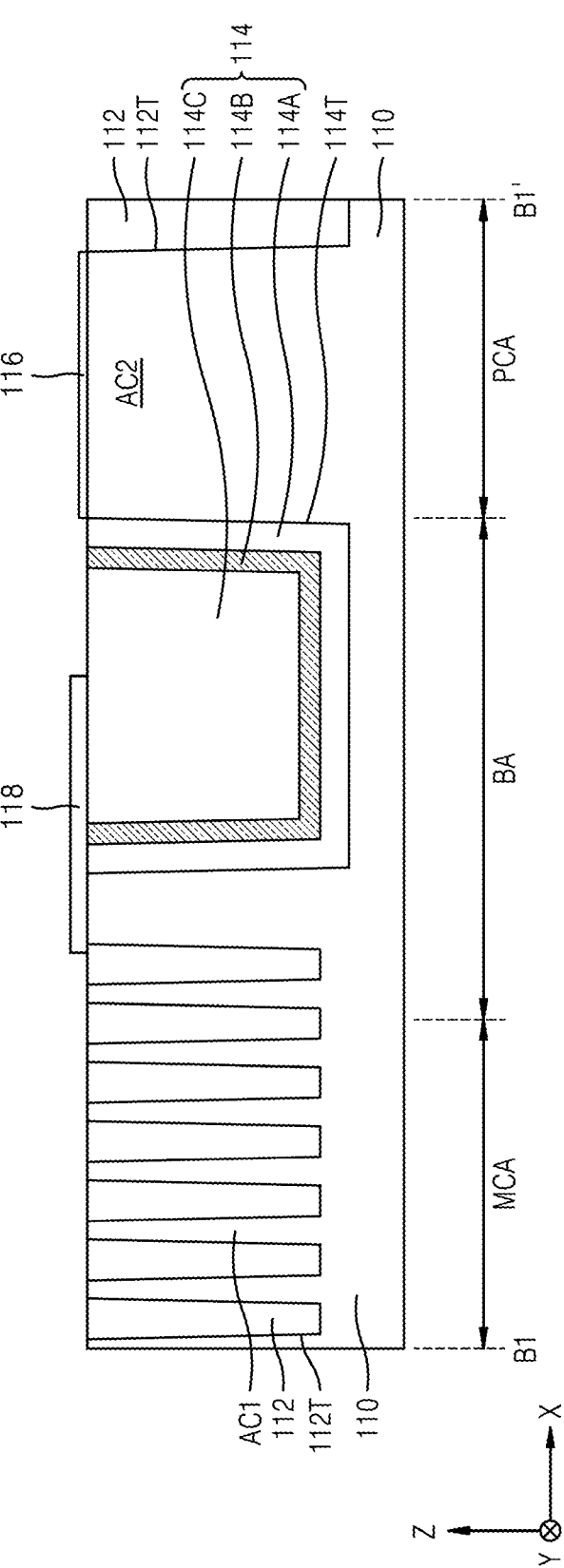

Referring to FIG. 9, the buffer layer 118 may be formed on the cell array area MCA and the boundary area BA. The buffer layer 118 may cover the upper surface of the first active area AC1 in the cell array area MCA, and the upper surface of the second active area AC2 in the peripheral circuit area PCA may not be covered by the buffer layer 118.

Thereafter, the gate dielectric layer 116 may be formed on the substrate 110 in the peripheral circuit area PCA. The gate dielectric layer 116 may be formed by, e.g., a thermal oxidation process, an ALD process, a CVD process, a PECVD process, an LPCVD process, etc.

Thereafter, a part of the buffer layer 118 covering the cell array area MCA may be removed, and the buffer layer 118 may remain on the boundary area BA. The buffer layer 118 may cover, e.g., only, the first active area AC1 and the upper surface of the device isolation layer 112 in the edge area of the cell array area MCA and may extend onto the boundary structure 114.

In some embodiments, a recess process may be performed on the upper surface of the device isolation layer 112 exposed in the cell array area MCA so that the upper surface of the first active area AC1 may be disposed at a higher level than the upper surface of the device isolation layer 112, and a part of the sidewall of the first active area AC1 may be exposed.

Figure 10:
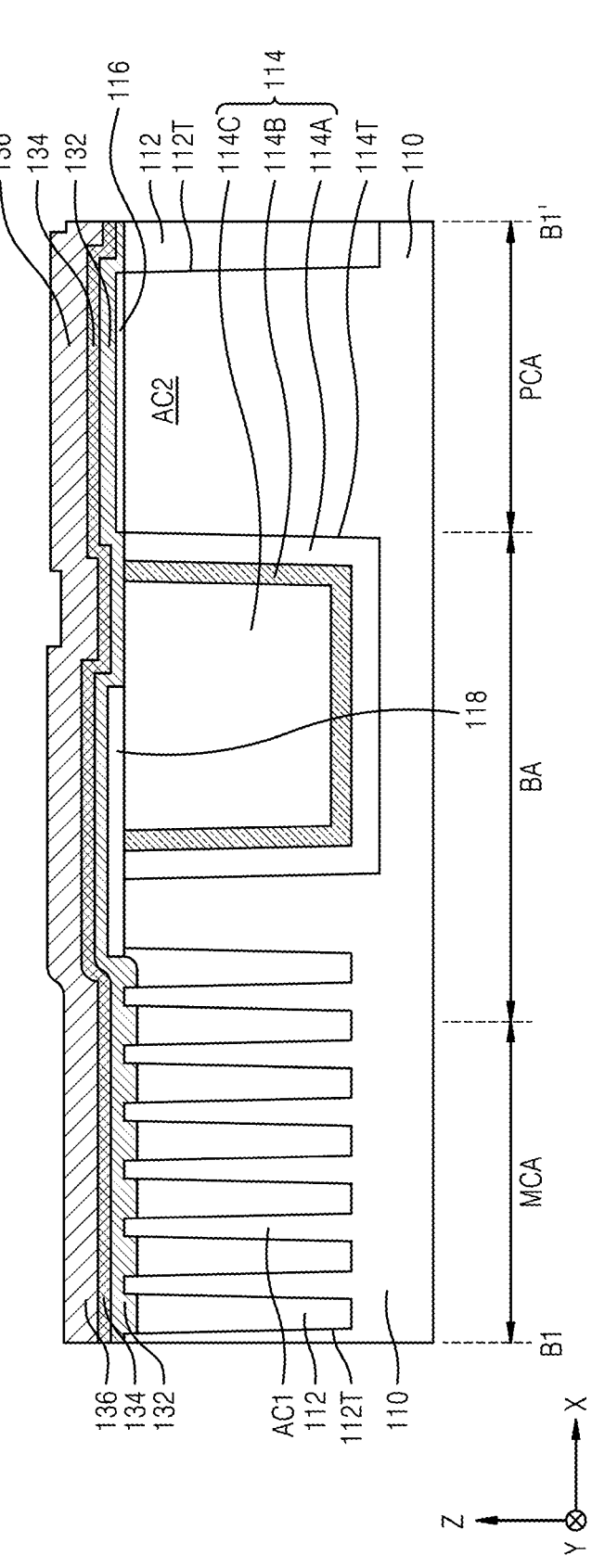

Referring to FIG. 10, the conductive layer 132 may be formed on the buffer layer 118 in the cell array area MCA and on the gate dielectric layer 116 and the device isolation layer 112 in the peripheral circuit area PCA. In some embodiments, the conductive layer 132 may include, e.g., Si, Ge, W, WN, Co, Ni, Al, Mo, Ru, Ti, TiN, Ta, TaN, Cu, or a combination thereof. For example, the conductive layer 132 may include polysilicon. For example, as illustrated in FIG. 10, the conductive layer 132 may be formed conformally and continuously on the entirety of the cell array area MCA and the peripheral circuit area PCA.

Thereafter, the intermediate layer 134 may be formed on the conductive layer 132, and the metal layer 136 may be formed on the intermediate layer 134. The intermediate layer 134 and the metal layer 136 may be formed on the entire area of the cell array area MCA and the peripheral circuit area PCA. In some embodiments, the intermediate layer 134 and the metal layer 136 may include, e.g., TiN, TiSiN, W, tungsten silicide, or a combination thereof.

Figure 11:
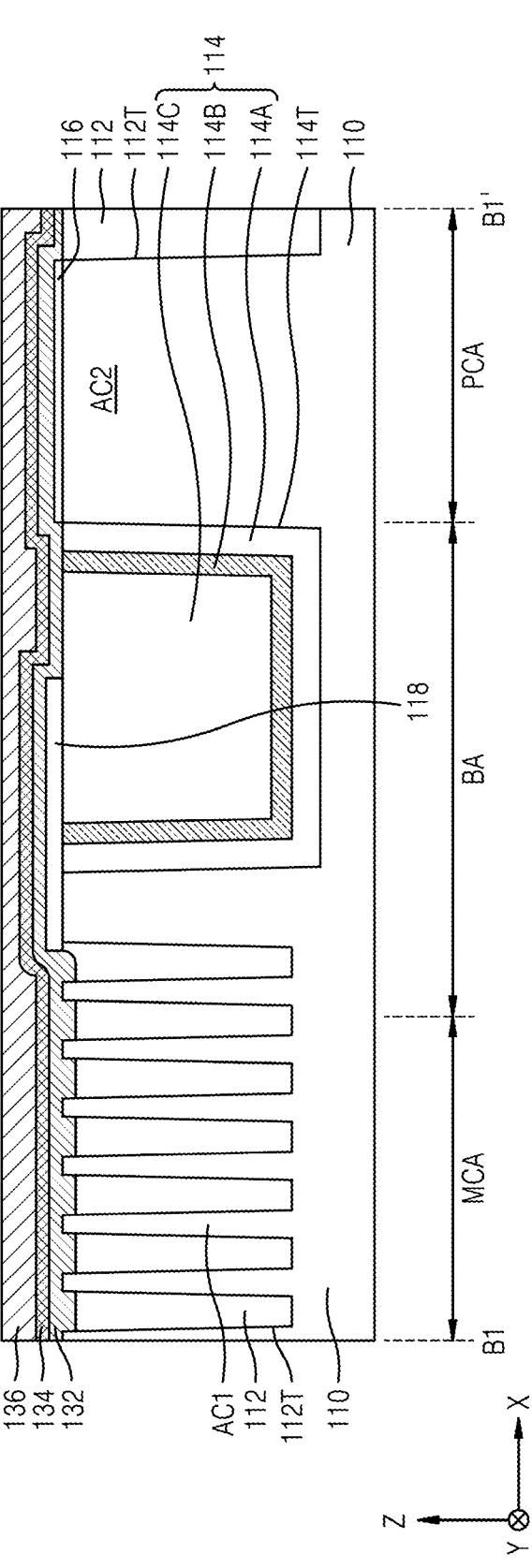

Referring to FIG. 11, a mask pattern may be formed on the metal layer 136 and may be used as an etch mask. The mask pattern may be formed on a part of each of the cell array area MCA and the boundary area BA, and may be excluded from an area to be etched. A part of the metal layer 136 may be removed by etching the upper surface of the metal layer 136 formed in the peripheral circuit area PCA and at least a part of the upper surface of the metal layer 136 formed in the boundary area BA, e.g., portions of the metal layer 136 in the peripheral circuit area PCA and in the boundary area BA may be removed to reduce an overall thickness of the metal layer 136 in the peripheral circuit area PCA and in the boundary area BA as compared to an overall thickness of the metal layer 136 in the cell array area MCA.

For example, as shown in FIG. 11, etching of the metal layer 136 formed in the peripheral circuit area PCA and the boundary area BA may be entirely performed. In addition, etching of the metal layer 136 may remove a step difference occurring between the first part (see 130P1 in FIG. 12) and the second part (see 130P2 in FIG. 12) of the cell pad extension portion (see 130_E in FIG. 12) due to the buffer layer 118. For example, as illustrated in FIG. 11, the upper surface of the metal layer 136 may be flat and parallel to a bottom of the substrate 110 in the entirety of the cell array area MCA, the peripheral circuit area PCA, and the boundary area BA.

It is difficult to precisely adjust a patterning process due to a level step difference of the upper surface of the cell pad extension portion 130_E disposed in the boundary area BA, e.g., a level step difference between the cell array area MCA and the boundary area BA due to the buffer layer 118 in the boundary area BA (FIG. 10), which may cause a process defect to occur. In contrast, according to embodiments, a level step difference in the upper surface of the cell pad extension portion 130_E (e.g., the level step difference between the cell array area MCA and the boundary area BA) is reduced or removed, thereby reducing the difficulty in patterning the cell pad structure 130 adjacent to the boundary area BA.

Figure 12:
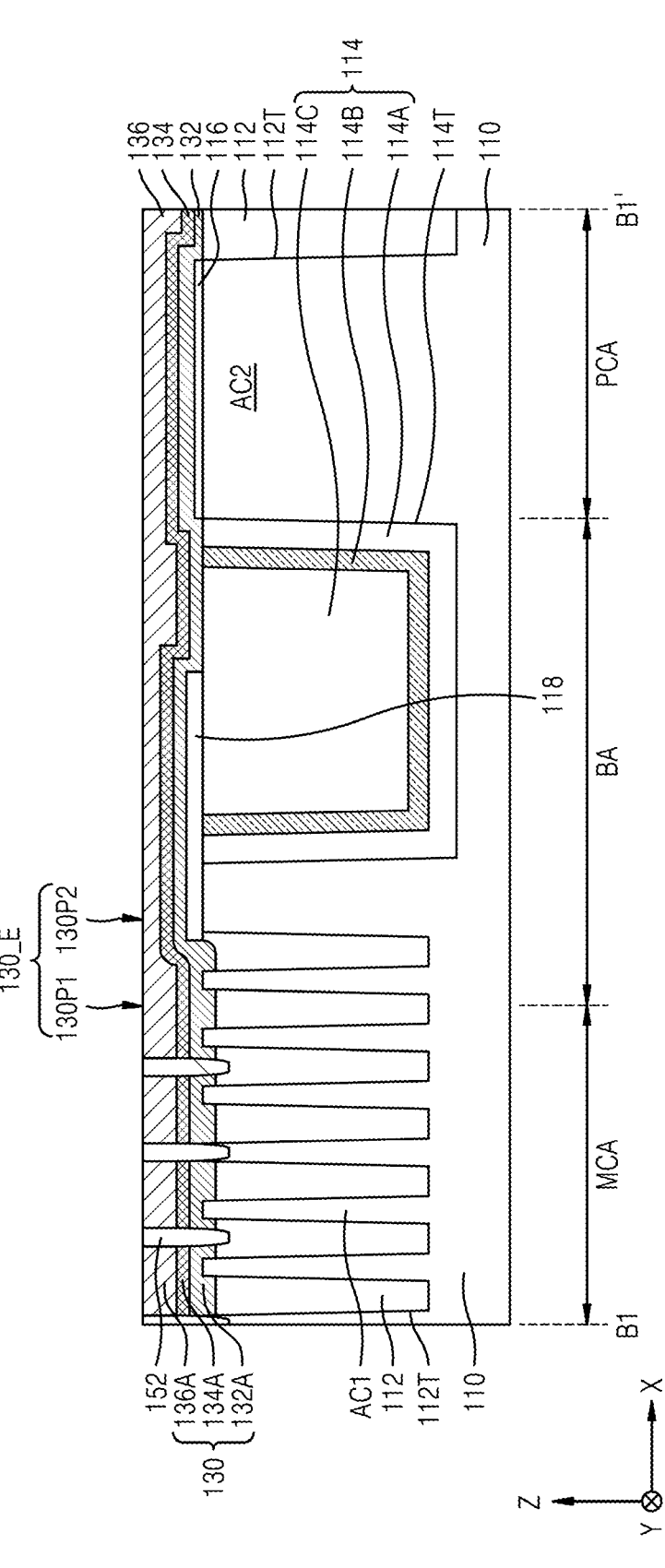

Referring to FIG. 12, the plurality of cell pad structures 130 may be formed by forming a mask pattern on the metal layer 136, and patterning the metal layer 136, the intermediate layer 134, and the conductive layer 132, e.g., only, in the cell array area MCA by using the mask pattern as an etch mask. In some embodiments, the plurality of cell pad structures 130 may have a matrix arrangement in which the plurality of cell pad structures 130 are spaced apart from each other in the first horizontal direction X and the second horizontal direction Y. The metal layer 136 may remain unpatterned on the peripheral circuit area PCA.

Among the plurality of cell pad structures 130, the outermost cell pad structure 130 (i.e., a cell pad structure 130 closest to the boundary area BA) may extend onto the boundary area BA. The cell pad structure 130 extending onto the boundary area BA may be referred to as the cell pad extension portion 130_E. The cell pad extension portion 130_E may include the first part 130P1 and the second part 130P2, the first part 130P1 may be disposed on the first active area AC1 and the device isolation layer 112, and the second part 130P2 may be disposed on the buffer layer 118.

Since the level step difference between the cell array area MCA and the boundary area BA is removed (FIG. 11), a height difference between the first part 130P1 and the second part 130P2 of the cell pad extension portion 130_E may be reduced or removed through the etching process of the metal layer 136 of FIG. 11, as compared to a case where there is no etching process of the metal layer 136. Further, in the process of FIG. 12, the patterning difficulty in forming the cell pad extension portion 130_E close to the boundary area BA may be reduced through the etching process of the metal layer 136. As the height of the metal layer 136 in the vertical direction is reduced, the patterning difficulty in the process of forming the plurality of cell pad structures 130 by patterning the metal layer 136, the intermediate layer 134, and the conductive layer 132 in the cell array area MCA may be reduced.

Thereafter, the insulating pattern 152 surrounding sidewalls of the plurality of cell pad structures 130 may be formed. The insulating pattern 152 may be made of, e.g., silicon nitride.

Figure 13:
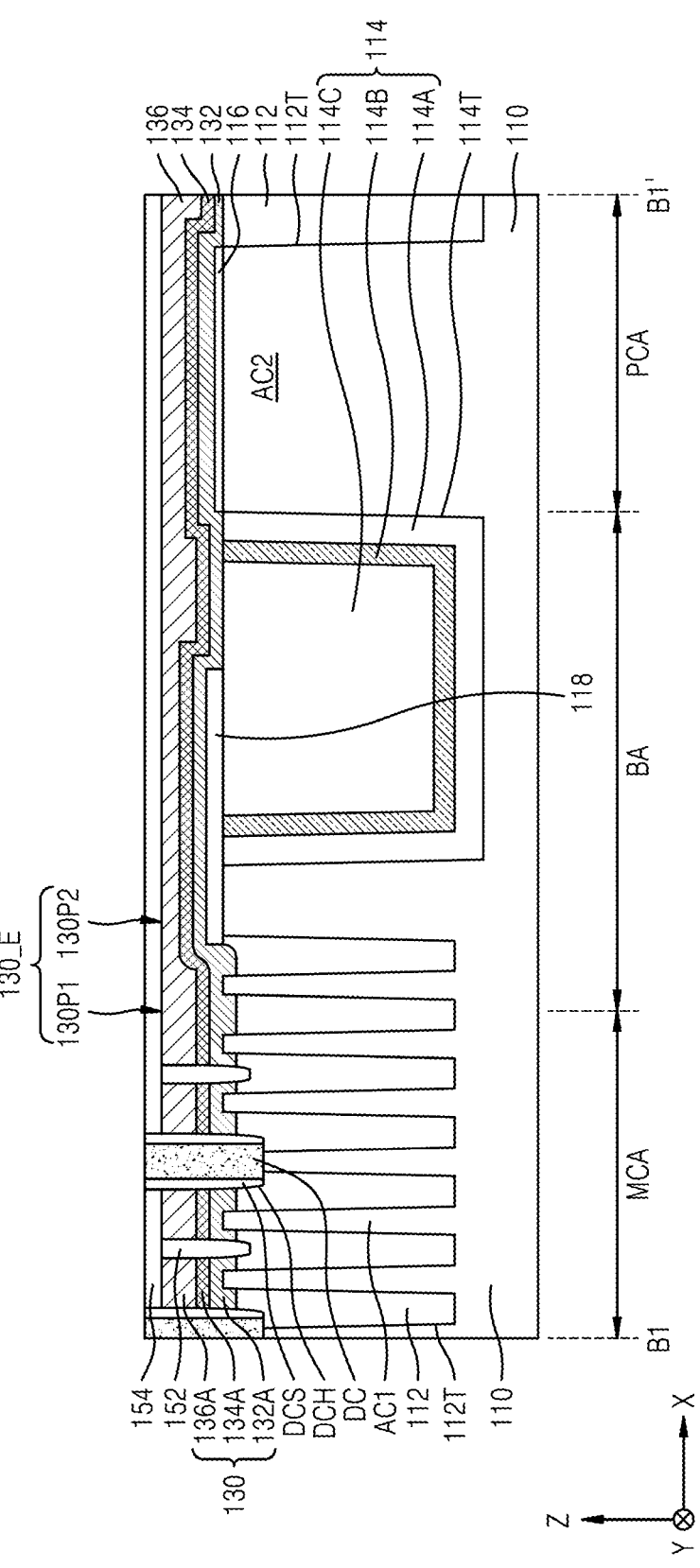

Referring to FIG. 13, the insulating layer 154 may be formed on upper surfaces of the plurality of cell pad structures 130 and the insulating pattern 152 and on the metal layer 136. The insulating layer 154 may be made of, e.g., silicon nitride.

Thereafter, the first active area AC1 of the substrate 110 may be exposed again by forming a mask pattern on the insulating layer 154 and removing some of the plurality of cell pad structures 130. Then, the direct contact hole DCH may be formed by further removing an exposed upper part of the substrate 110.

Thereafter, the direct contact spacer DCS may be formed on the inner wall of the direct contact hole DCH. For example, the direct contact spacer DCS may be made of, e.g., silicon nitride or silicon oxide. The direct contact DC may be formed inside the direct contact hole DCH by forming a conductive layer inside the direct contact hole DCH and etching back the upper portion of the conductive layer until the upper surface of the insulating layer 154 is exposed.

Figure 14:
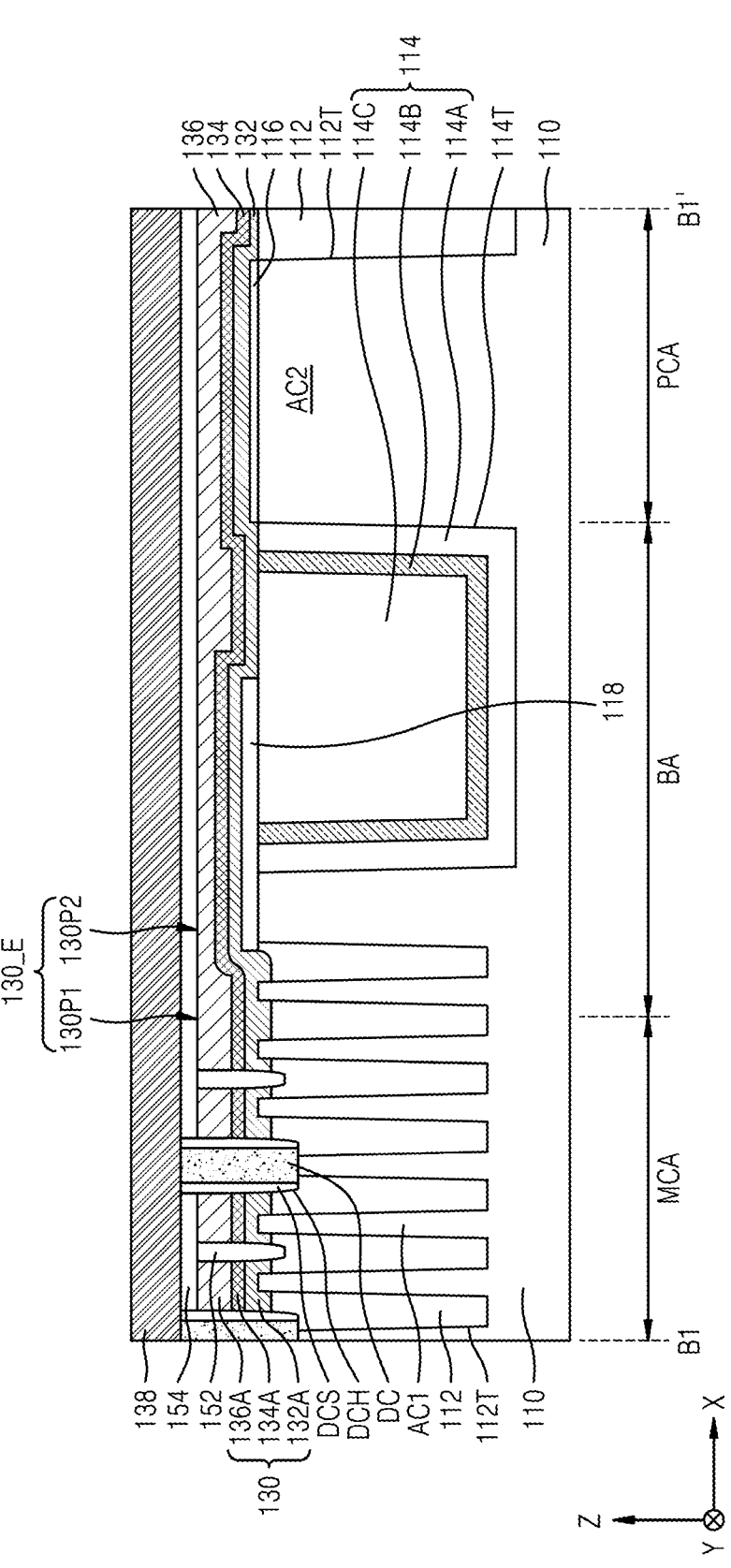

Referring to FIG. 14, the bit line conductive layer 138 covering the direct contact DC and the insulating layer 154 may be formed. The bit line conductive layer 138 may include, e.g., at least one of ruthenium (Ru), tungsten (W), cobalt (Co), titanium (Ti), or titanium nitride (TiN).

In some embodiments, the bit line conductive layer 138 may be made of a material different from the material included in the metal layer 136. However, the bit line conductive layer 138 is not limited thereto, and may be made of the same material as the material included in the metal layer 136.

Figure 15:
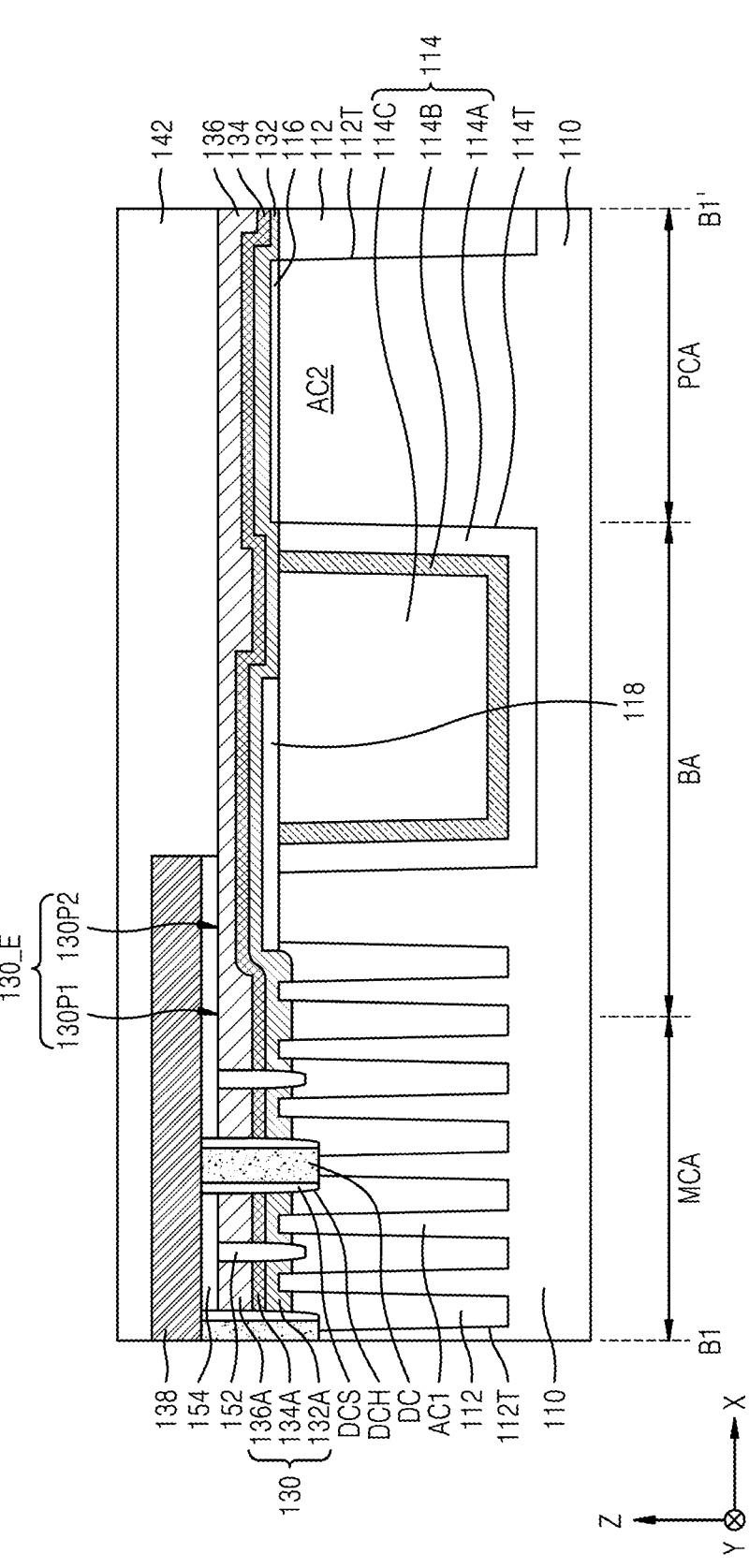

Referring to FIG. 15, the insulating layer 154 and the bit line conductive layer 138 may be removed from the peripheral circuit area PCA and the boundary area BA. Thereafter, the first insulating capping layer 142 may be formed on the metal layer 136 in the peripheral circuit area PCA and on the bit line conductive layer 138 in the cell array area MCA.

Figure 16:
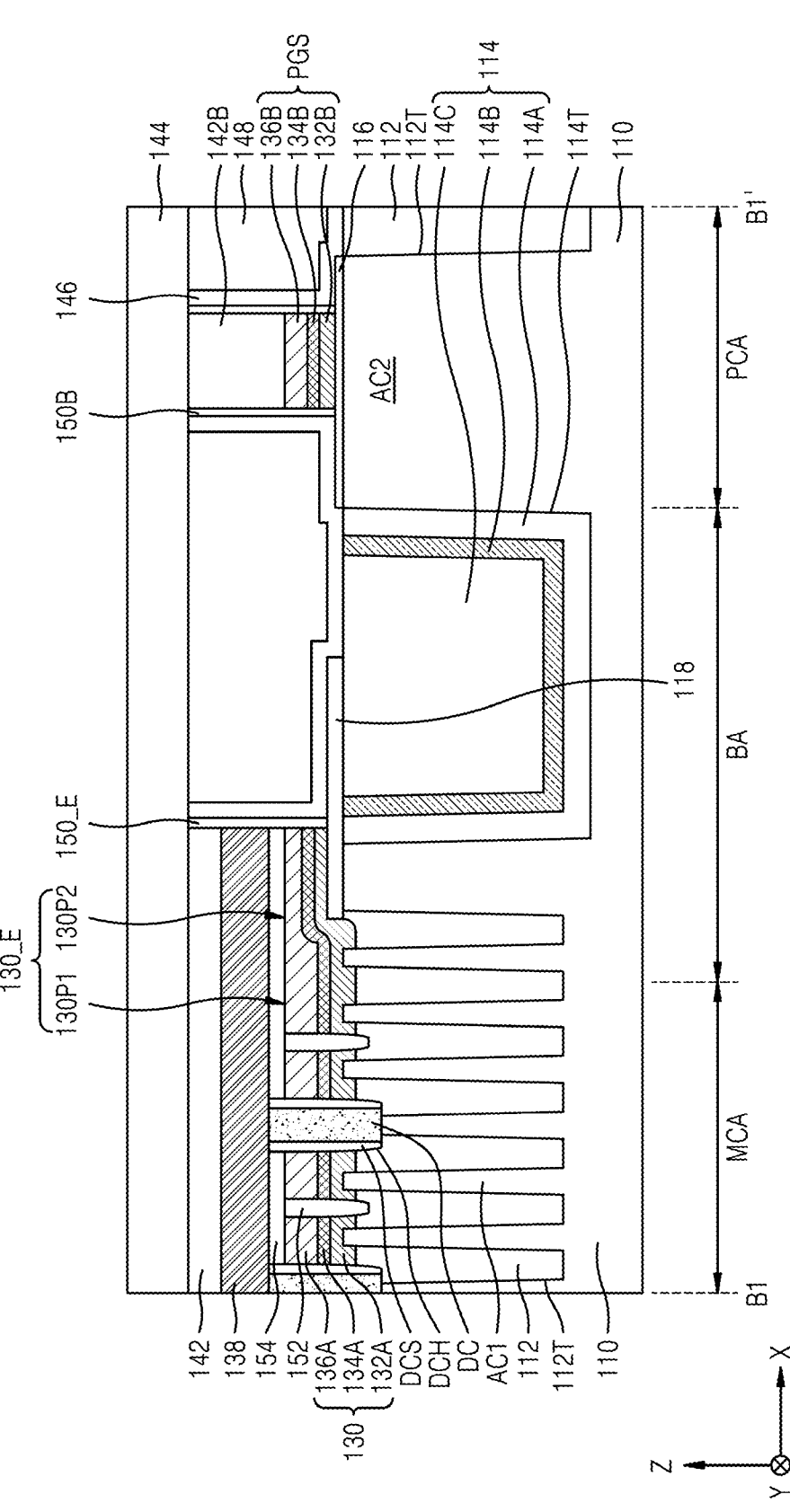

Referring to FIG. 16, the gate capping pattern 142B and the peripheral circuit gate electrode PGS may be formed by forming a mask pattern on the first insulating capping layer 142, and patterning the first insulating capping layer 142, the metal layer 136, the intermediate layer 134, and the conductive layer 132 in the peripheral circuit area PCA by using the mask pattern. In some embodiments, the peripheral circuit gate electrode PGS may include the second conductive layer 132B, the second intermediate layer 134B, and the second metal layer 136B sequentially disposed on the gate dielectric layer 116.

Thereafter, the insulating spacer 150B covering the sidewall of the peripheral circuit gate structure PG may be formed. The insulating spacer 150B may be made of, e.g., silicon nitride. Meanwhile, in the process of forming insulating spacer 150B, the spacer 150_E may also be disposed on the sidewall of the cell pad extension portion 130_E disposed in the boundary area BA.

Thereafter, the passivation layer 146 covering sidewalls of the gate capping pattern 142B and the peripheral circuit gate electrode PGS is formed in the peripheral circuit area PCA. The first interlayer insulating layer 148 may be formed by forming an insulating layer on the passivation layer 146 to completely cover the gate capping pattern 142B and the peripheral circuit gate electrode PGS, and planarizing the upper portion of the insulating layer until the upper surface of the gate capping pattern 142B is exposed.

Figure 17A:
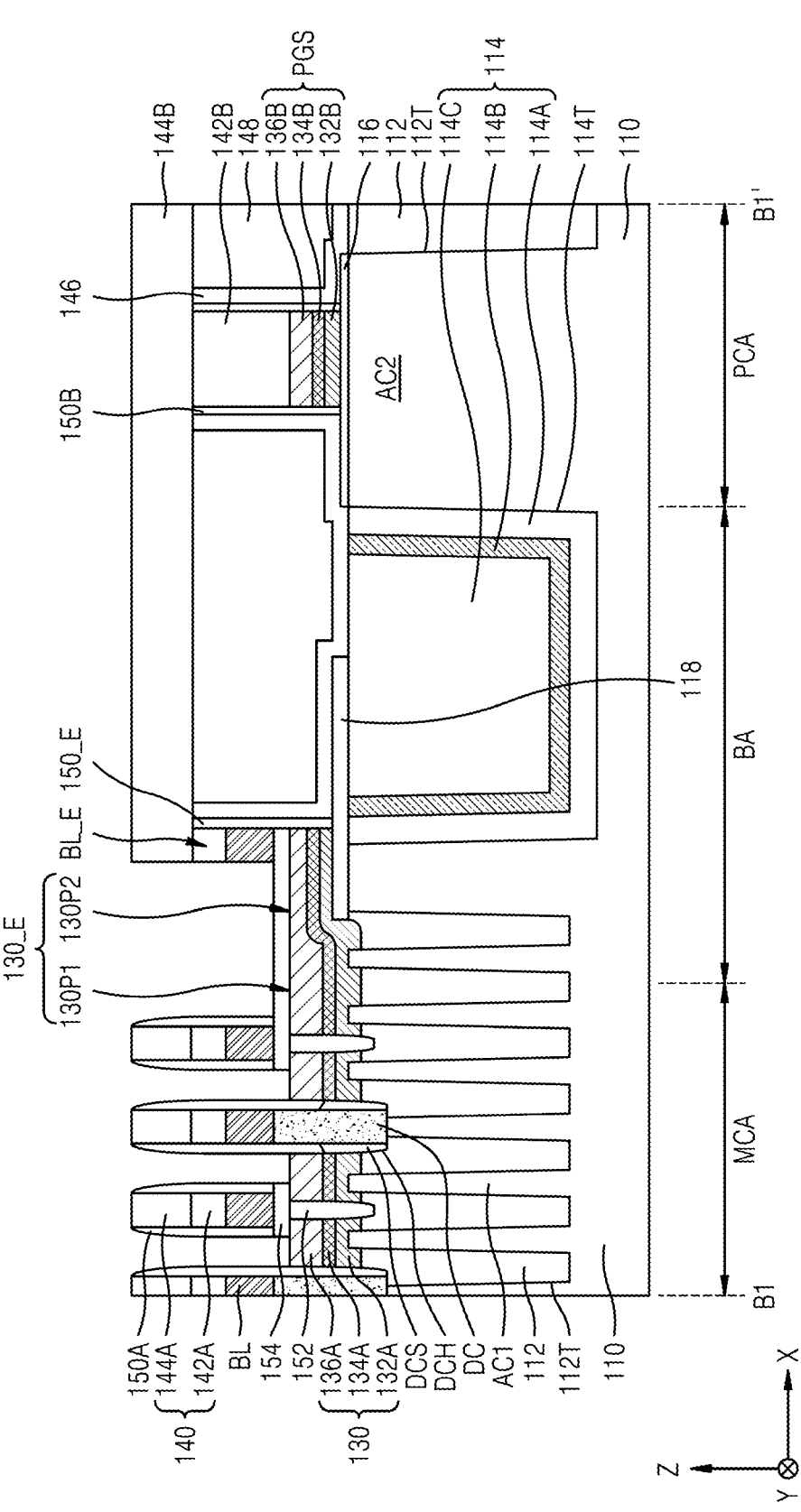
Figure 17B:
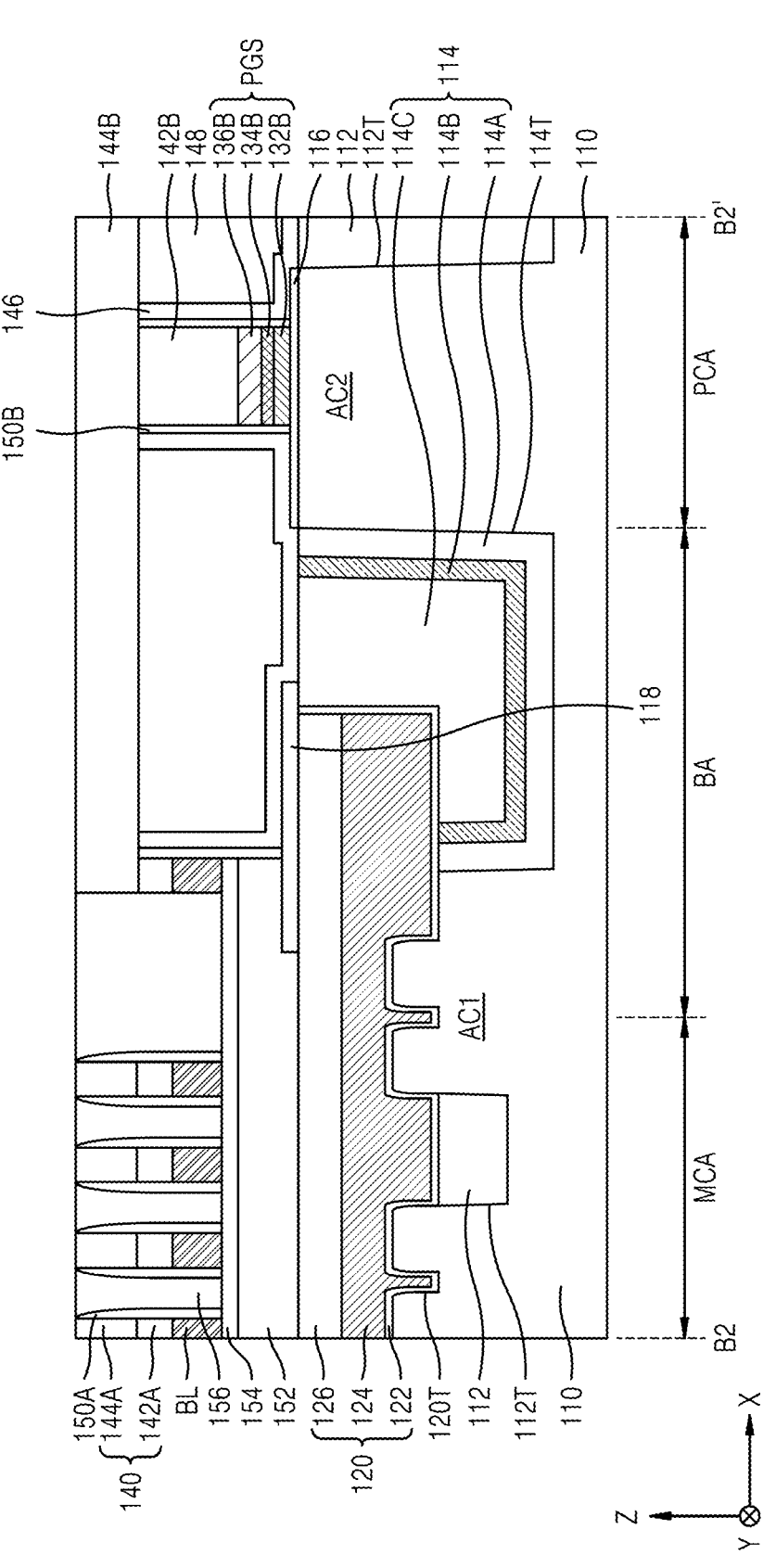

Referring to FIGS. 17A and 17B, the second insulating capping layer 144 may be formed on the first insulating capping layer 142 in the cell array area MCA and on a first interlayer insulating film in the peripheral circuit area PCA. Thereafter, the plurality of insulating capping structures 140 and the plurality of bit lines BL may be formed by patterning the second insulating capping layer 144, the first insulating capping layer 142, and the bit line conductive layer 138 in the cell array area MCA.

In the process of forming the bit line BL, an upper part of the direct contact spacer DCS disposed inside the direct contact hole DCH may be removed together, and the upper surface of the direct contact spacer DCS may be disposed at a level lower than the upper surface of the direct contact DC. In the process of forming the bit line BL, a part of the bit line conductive layer 138 may remain on the boundary area BA, and may be referred to as the edge conductive layer BL_E.

Thereafter, the bit line spacer 150A may be formed on the sidewall of a bit line structure BLS, and the plurality of insulating fences 156 may be formed between the plurality of bit lines BL.

Figure 18:
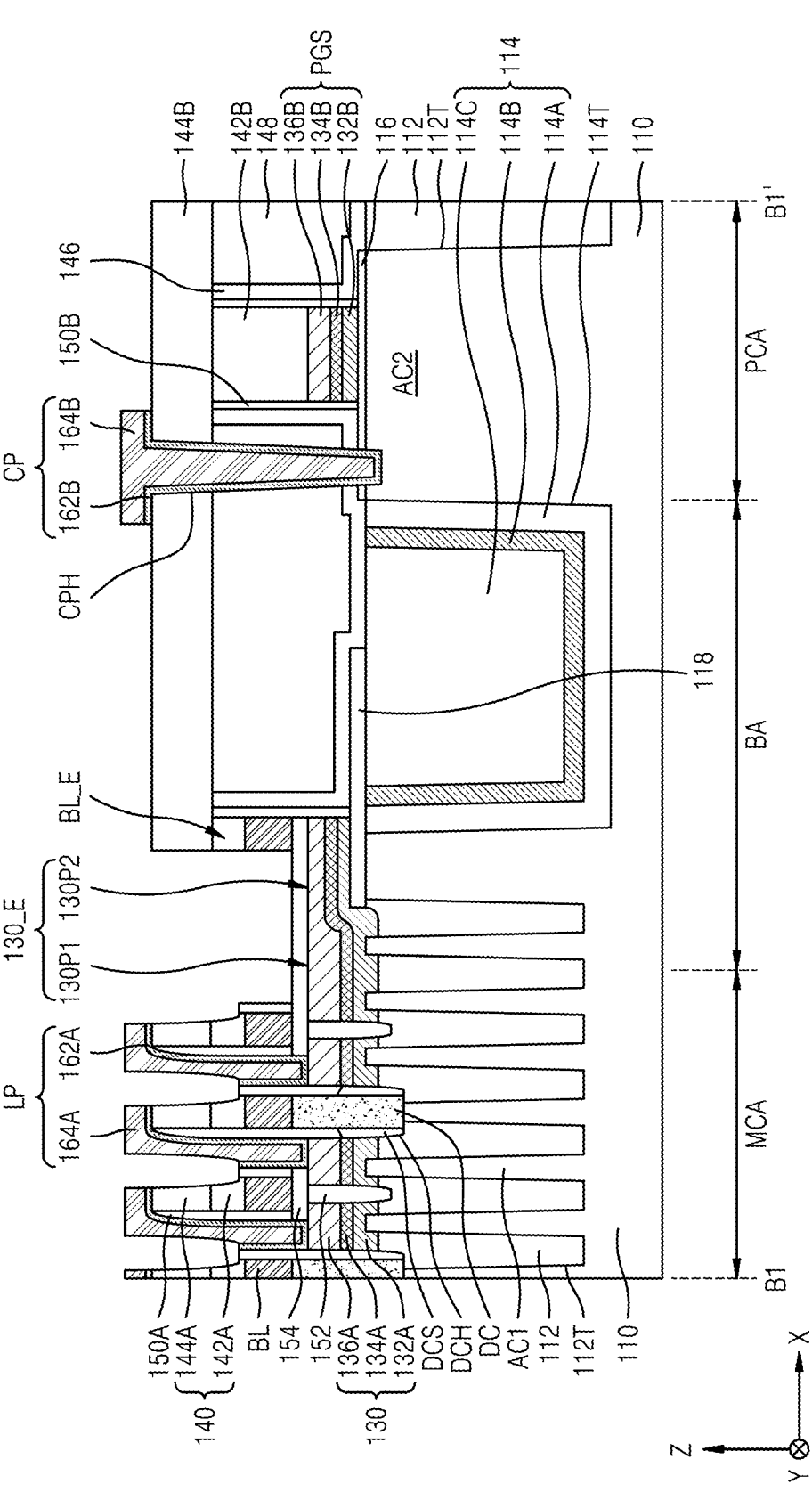

Referring to FIG. 18, the plurality of contact holes CPH exposing the second active area AC2 of the substrate 110 may be formed by etching the second insulating capping layer 144 and the first interlayer insulating layer 148 in the peripheral circuit area PCA. Thereafter, the upper surface of the cell pad structure 130 is exposed by removing the insulating layer 154 exposed between the bit lines BL in the cell array area MCA.

Then, the conductive barrier layer 162 and the conductive layer 164 are formed to cover surfaces exposed on the substrate 110 in the cell array area MCA and the peripheral circuit area PCA. The plurality of landing pads LP each including the conductive barrier film 162A and the conductive landing pad layer 164A may be formed in the cell array area MCA by patterning the conductive barrier layer 162 and the conductive layer 164, and the plurality of contact plugs CP each including the plug conductive barrier film 162B and the plug conductive layer 164B may be formed in the peripheral circuit area PCA.

15

Figure 19:
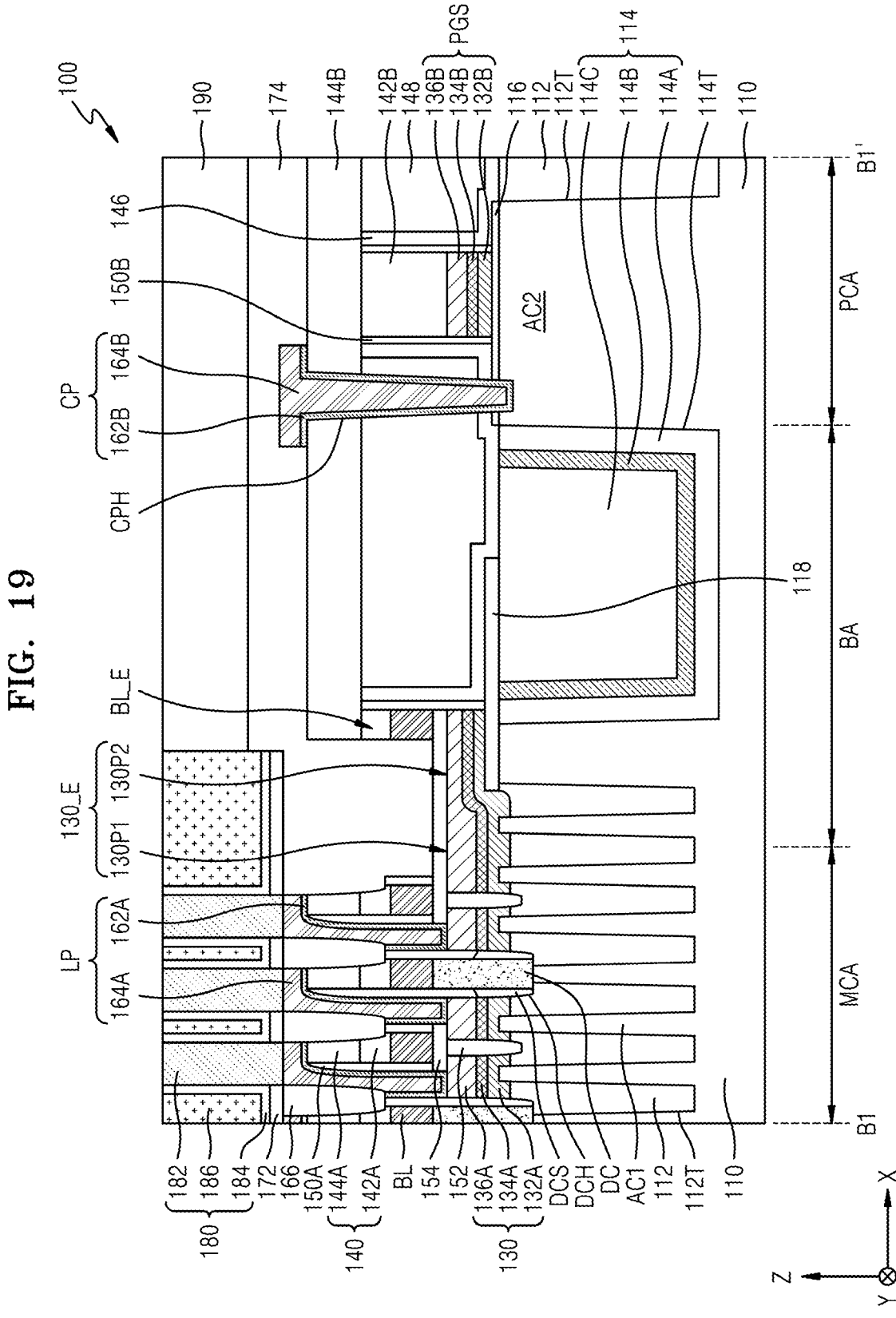

Referring to FIG. 19, the insulating pattern 166 covering the plurality of landing pads LP may be formed in the cell array area MCA, and the second etch stop layer 174 covering the plurality of contact plugs CP may be formed in the peripheral circuit area PCA.

Thereafter, the first etch stop layer 172 may be formed on the cell array area MCA. The plurality of lower electrodes 182 penetrating the first etch stop layer 172 and connected to the landing pads LP may be formed, and the capacitor dielectric layer 184 and the upper electrode 186 may be formed sequentially on sidewalls of the plurality of lower electrodes 182. Thereafter, the second interlayer insulating layer 190 covering the upper electrode 186 may be formed on the cell array area MCA and the peripheral circuit area PCA.

The semiconductor device 100 may be completed by performing the method described above.

By way of summation and review, embodiments provide a semiconductor device with an improved patterning difficulty and an improved performance. That is, according to embodiments, the cell pad structure and the peripheral circuit gate electrode may be formed simultaneously of the same stacked layers, followed by removal of a step difference between portions of a metal layer in the cell pad structure and the peripheral circuit gate electrode, thereby simplifying patterning of the cell pad structure at a boundary area adjacent to the peripheral circuit gate. In addition, as the height of the peripheral circuit gate electrode is reduced (by removal of the step difference), an overlap area between side surfaces of the peripheral circuit gate electrode and the contact plug is reduced, thereby reducing an influence between the peripheral circuit gate electrode and the contact plug, and decreasing capacitance generated in the overlap area between the contact plug and the peripheral circuit gate electrode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a cell array area and a peripheral circuit area;
first active areas defined in the cell array area of the substrate;
at least one second active area defined in the peripheral circuit area of the substrate;
bit lines on the cell array area of the substrate, the bit lines extending in a first direction;
cell pad structures between the bit lines, each of the cell pad structures including a first conductive layer, a first intermediate layer, and a first metal layer sequentially stacked on an upper surface of a corresponding one of the first active areas, and the first metal layer having a first height from an upper surface of the first intermediate layer; and

a peripheral circuit gate electrode on the peripheral circuit area of the substrate, the peripheral circuit gate electrode including a second conductive layer, a second intermediate layer, and a second metal layer sequentially stacked on the at least one second active area, the second metal layer having a second height from an upper surface of the second intermediate layer that is less than the first height.

2. The semiconductor device as claimed in claim 1, wherein:
the first conductive layer includes a same material as a material included in the second conductive layer,
the first intermediate layer includes a same material as a material included in the second intermediate layer, and
the first metal layer includes a same material as a material included in the second metal layer.

3. The semiconductor device as claimed in claim 1, further comprising a contact plug spaced apart from a side surface of the peripheral circuit gate electrode, a vertical length of an overlap area between side surfaces of the peripheral circuit gate electrode and the contact plug being less than a height of each of the cell pad structures.

4. The semiconductor device as claimed in claim 1, further comprising:
a boundary structure in a boundary area of the substrate, the boundary area being between the cell array area and the peripheral circuit area, and the boundary structure being in a boundary trench and including an insulating material; and
a buffer layer on the boundary structure,
wherein at least one of the cell pad structures includes a first part and a second part, the first part being on the first active areas, and the second part being on the buffer layer.

5. The semiconductor device as claimed in claim 4, wherein the first part and the second part are on a same plane.

6. The semiconductor device as claimed in claim 4, wherein an upper surface of the first part and an upper surface of the second metal layer of the peripheral circuit gate electrode are coplanar.

7. The semiconductor device as claimed in claim 1, wherein a difference between the first height and the second height is equal to or greater than 5 nm.

8. The semiconductor device as claimed in claim 1, wherein:
each of the bit lines has a third height from a lower surface of each of the bit lines to an upper surface thereof in a vertical direction, and
the second height is different from the third height.

9. The semiconductor device as claimed in claim 1, wherein a material included in each of the bit lines is different from a material included in the peripheral circuit gate electrode.

10. The semiconductor device as claimed in claim 1, wherein upper surfaces of the first metal layer and the second metal layer are coplanar.

11. The semiconductor device as claimed in claim 1, wherein the first conductive layer covers an upper surface and part of a side surface of each of the first active areas.

12. The semiconductor device as claimed in claim 1, further comprising:
a direct contact between each of the bit lines and a corresponding one of the first active areas of which an upper surface is in contact with the direct contact, and the direct contact including a metal material;

a direct contact spacer between the direct contact and each of the cell pad structures; and a bit line spacer on a sidewall of each of the bit lines.

13. The semiconductor device as claimed in claim 12, wherein:

a sidewall of the first conductive layer of each of the cell pad structures is in contact with the direct contact spacer, and a sidewall of the first metal layer of each of the cell pad structures is in contact with the bit line spacer.

14. A semiconductor device, comprising:

a substrate including a cell array area, a boundary area, and a peripheral circuit area;

first active areas defined in the cell array area of the substrate;

at least one second active area defined in the peripheral circuit area of the substrate;

bit lines on the cell array area of the substrate, the bit lines extending in a first direction;

cell pad structures between the bit lines, each of the cell pad structures including a first conductive layer, a first intermediate layer, and a first metal layer sequentially stacked on an upper surface of a corresponding one of the first active areas; and a peripheral circuit gate electrode on the peripheral circuit area of the substrate, the peripheral circuit gate electrode including a second conductive layer, a second intermediate layer, and a second metal layer sequentially stacked on the at least one second active area, a thickness of each of the cell pad structures being greater than a thickness of the peripheral circuit gate electrode.

15. The semiconductor device as claimed in claim 14, wherein:

the first metal layer has a first height from an upper surface of the first intermediate layer in a vertical direction, the second metal layer has a second height from an upper surface of the second intermediate layer in the vertical direction, and the second height is less than the first height.

16. The semiconductor device as claimed in claim 14, wherein:

the first conductive layer includes a same material as a material included in the second conductive layer, and the first metal layer includes a same material as a material included in the second metal layer.

17. The semiconductor device as claimed in claim 14, further comprising:

a direct contact between each of the bit lines and a corresponding one of the first active areas;

a direct contact spacer between the direct contact and each of the cell pad structures; and a bit line spacer on a sidewall of each of the bit lines.

18. The semiconductor device as claimed in claim 17, wherein:

a sidewall of the first conductive layer of each of the cell pad structures is in contact with the direct contact spacer, and a sidewall of the first metal layer of each of the cell pad structures is in contact with the bit line spacer.

19. A semiconductor device, comprising:

a substrate including a cell array area, a boundary area, and a peripheral circuit area;

first active areas defined in the cell array area of the substrate;

at least one second active area defined in the peripheral circuit area of the substrate;

bit lines on the cell array area of the substrate, the bit lines extending in a first direction;

a direct contact between each of the bit lines and a corresponding one of the first active areas, the direct contact electrically connecting each of the bit lines to the corresponding one of the first active areas;

a direct contact spacer surrounding a sidewall of the direct contact;

cell pad structures between the bit lines, each of the cell pad structures including a first conductive layer, a first intermediate layer, and a first metal layer sequentially stacked on an upper surface of a corresponding one of the first active areas;

landing pads on the cell pad structures, respectively; and a peripheral circuit gate electrode on the peripheral circuit area of the substrate, the peripheral circuit gate electrode including a second conductive layer, a second intermediate layer, and a second metal layer sequentially stacked on the at least one second active area, wherein the second metal layer includes a same material as a material included in the first metal layer, and wherein the first metal layer has a first height in a vertical direction, the second metal layer has a second height in the vertical direction, the first height is greater than the second height, and a difference between the first height and the second height is equal to or greater than 5 nm.

20. The semiconductor device as claimed in claim 19, further comprising:

a boundary structure in a boundary trench extending into the boundary area of the substrate, the boundary structure including an insulating material; and a buffer layer on the boundary structure, wherein at least one of the cell pad structures includes a first part and a second part, the first part being on the first active areas, the second part being on the buffer layer, and the first part and the second part being on a same plane.

* * * * *